United States Patent
Nishino

(10) Patent No.: US 11,725,983 B2
(45) Date of Patent: Aug. 15, 2023

(54) LIGHT RECEIVING DEVICE AND DISTANCE MEASURING DEVICE COMPRISING A CIRCUIT TO PROTECT A CIRCUIT ELEMENT OF A READOUT CIRCUIT FROM OVERVOLTAGE

(71) Applicant: Sony Semiconductor Solutions Corporation, Kanagawa (JP)

(72) Inventor: Tatsuki Nishino, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/912,251

(22) PCT Filed: Feb. 20, 2021

(86) PCT No.: PCT/JP2021/006513
§ 371 (c)(1),
(2) Date: Sep. 16, 2022

(87) PCT Pub. No.: WO2021/192770
PCT Pub. Date: Sep. 30, 2021

(65) Prior Publication Data
US 2023/0145695 A1 May 11, 2023

(30) Foreign Application Priority Data

Mar. 24, 2020 (JP) .................. 2020-052503

(51) Int. Cl.
*G01J 1/44* (2006.01)
*G01C 3/06* (2006.01)
*H01L 31/107* (2006.01)

(52) U.S. Cl.
CPC .................. *G01J 1/44* (2013.01); *G01C 3/06* (2013.01); *H01L 31/107* (2013.01); *G01J 2001/442* (2013.01); *G01J 2001/4466* (2013.01)

(58) Field of Classification Search
CPC ......... G01J 1/44; G01J 2001/44; G01S 7/486; H01L 27/146; H01L 31/107
(Continued)

(56) References Cited

U.S. PATENT DOCUMENTS

2011/0240865 A1  10/2011  Frach et al.
2020/0256961 A1*  8/2020  Gaalema ................ G01N 21/55

FOREIGN PATENT DOCUMENTS

JP   H0346273 A   2/1991
JP   H0376264 A   4/1991
(Continued)

OTHER PUBLICATIONS

International Search Report (PCT/ISA/210), International Application No. PCT/JP2021/006513, dated May 18, 2021.

*Primary Examiner* — Que Tan Le
(74) *Attorney, Agent, or Firm* — Michael Best & Friedrich LLP

(57) ABSTRACT

A light receiving device according to the present disclosure includes: a light receiving element that generates a signal in response to reception of a photon; a readout circuit that reads out a signal generated by the light receiving element; and a protection circuit that is provided between the light receiving element and the readout circuit and protects a circuit element of the readout circuit from overvoltage. Further, a distance measuring device according to the present disclosure includes a light receiving device of the above configuration.

20 Claims, 22 Drawing Sheets

(58) Field of Classification Search
USPC .............................................. 250/214 R, 221
See application file for complete search history.

(56) References Cited

FOREIGN PATENT DOCUMENTS

| | | |
|---|---|---|
| JP | H088391 A | 1/1996 |
| JP | H11220657 A | 8/1999 |
| JP | 2002314754 A | 10/2002 |
| JP | 2012004545 A | 1/2012 |
| JP | 2015004681 A | 1/2015 |
| JP | 2019125717 A | 7/2019 |
| WO | 2017141957 A1 | 8/2017 |

* cited by examiner

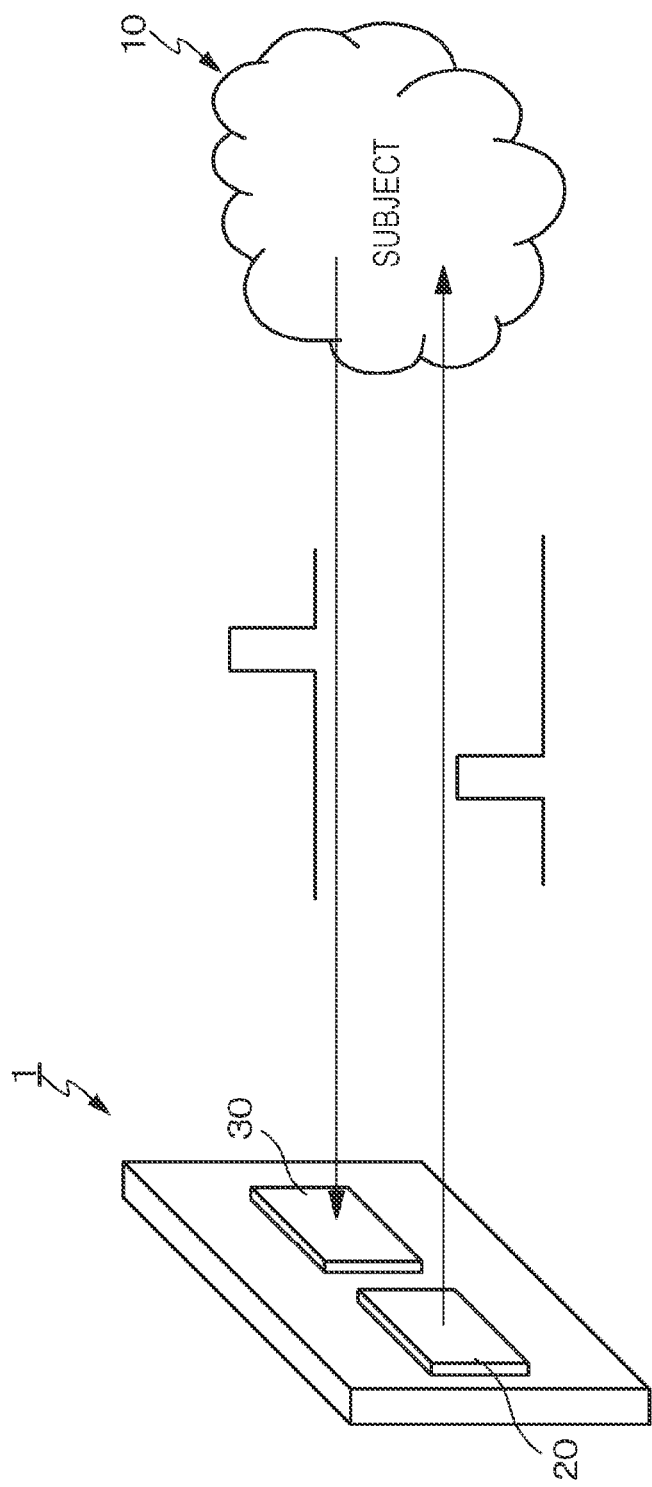

LIGHT RECEIVING DEVICE AND DISTANCE MEASURING DEVICE COMPRISING A CIRCUIT TO PROTECT A CIRCUIT ELEMENT OF A READOUT CIRCUIT FROM OVERVOLTAGE

TECHNICAL FIELD

The present disclosure relates to a light receiving device and a distance measuring device.

BACKGROUND ART

There is a light receiving device (light detecting device) using, as a light receiving element (light detecting element), an element that generates a signal in response to reception of a photon. In this type of light receiving device, for example, a time-of-flight (ToF) method of measuring the time until light applied from a light source toward a distance measurement target is reflected by the distance measurement target and returns is employed as a measurement method of measuring the distance to a distance measurement target (subject).

As a light receiving element that generates a signal in response to reception of a photon, for example, a single-photon avalanche diode (SPAD) element is known. In a light receiving device using a SPAD element as a light receiving element, the SPAD element is used by applying a voltage not less than the breakdown voltage to the anode electrode (or the cathode electrode) of the SPAD element, due to the configuration of the light receiving device (for example, see Patent Document 1).

CITATION LIST

Patent Document

Patent Document 1: Japanese Patent Application Laid-Open No. 2019-125717

SUMMARY OF THE INVENTION

Problems to be Solved by the Invention

Meanwhile, in a case where the SPAD element is irradiated with a large amount of laser light not less than expected (not less than a predetermined amount of light), such as a case where the SPAD element is directly irradiated with laser light, the SPAD element is strongly affected by photoelectric conversion due to a large amount of light, and consequently the internal impedance greatly lowers. As a result, an excessive voltage is applied to a readout circuit that reads out a signal generated by the SPAD element, and circuit elements included in the readout circuit may be broken.

The above problem applies not only to the SPAD element but also to all light receiving elements that generate a signal in response to reception of a photon.

Thus, an object of the present disclosure is to provide a light receiving device capable of protecting circuit elements included in a readout circuit in a later stage from overvoltage even in a case where a light receiving element is irradiated with a large amount of light not less than a predetermined amount of light, and a distance measuring device including the light receiving device.

Solutions to Problems

A light receiving device of the present disclosure for achieving the above object includes:

a light receiving element that generates a signal in response to reception of a photon;

a readout circuit that reads out a signal generated by the light receiving element; and a protection circuit that is provided between the light receiving element and the readout circuit and protects a circuit element of the readout circuit from overvoltage.

Furthermore, a distance measuring device of the present disclosure for achieving the above object includes:

a light source section that applies light to a distance measurement target; and a light receiving device that receives reflected light from the distance measurement target based on applied light from the light source section.

Then, the light receiving device includes:

a light receiving element that generates a signal in response to reception of a photon;

a readout circuit that reads out a signal generated by the light receiving element; and a protection circuit that is provided between the light receiving element and the readout circuit and protects a circuit element of the readout circuit from overvoltage.

BRIEF DESCRIPTION OF DRAWINGS

FIG. 1 is a schematic configuration diagram showing an example of a distance measuring device to which the technology according to the present disclosure is applied.

MODE FOR CARRYING OUT THE INVENTION

Figure 2A:
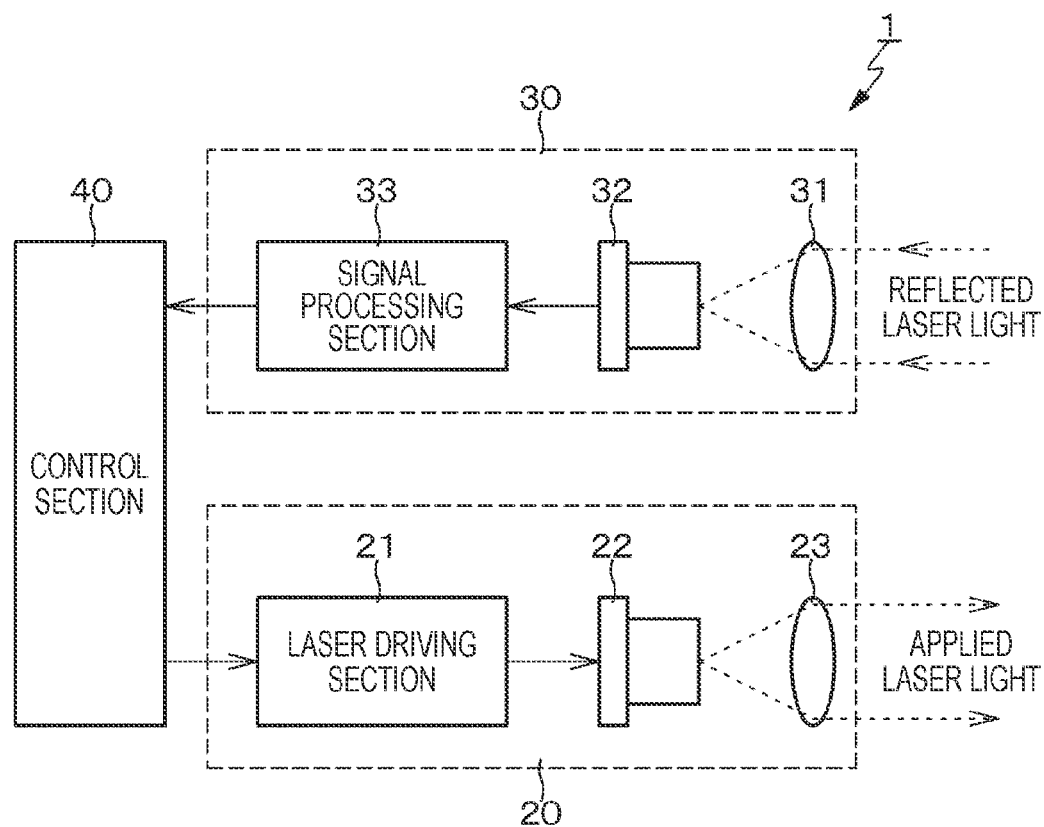
FIG. 2A and FIG. 2B are block diagrams showing an example of a specific configuration of a distance measuring device according to the present application example.

Hereinbelow, modes for implementing the technology of the present disclosure (hereinafter, referred to as "embodiments") are described in detail using the drawings. The technology of the present disclosure is not limited to the embodiments. In the following description, the same reference numerals are used for the same elements or elements having the same functions, and a repeated description is omitted. Note that the description is given in the following order.

1. General description of light receiving device and distance measuring device of present disclosure
2. Distance measuring device to which technology according to present disclosure is applied
2-1. Specific configuration example of distance measuring device
2-2. Basic pixel circuit example using SPAD element
2-3. Circuit operation example of pixel circuit using SPAD element
2-4. Overvoltage applied to readout circuit of SPAD element
3. Light receiving device according to embodiment of present disclosure 3-1. Example 1 (example of negative bias configuration: example in which protection circuit includes clamping circuit)
3-2. Example 2 (modification example of Example 1: example in which second clamping element is omitted)
3-3. Example 3 (example of negative bias configuration: example in which protection circuit includes resistance element)
3-4. Example 4 (modification example of Example 1: example in which first clamping element is configured by using N-type MOS transistor of diode-connected configuration)
3-5. Example 5 (modification example of Example 1: example in which first clamping element is configured by using P-type MOS transistor of diode-connected configuration)
3-6. Example 6 (modification example of Example 5: example in which resistance element is provided between gate and drain of P-type MOS transistor)
3-7. Example 7 (example of positive bias configuration: example in which protection circuit includes clamping circuit)
3-8. Example 8 (modification example of Example 7: example in which second clamping element is omitted)
3-9. Example 9 (example of positive bias configuration: example in which protection circuit includes resistance element)
4. Modification examples
5. Application example of technology according to present disclosure (example of mobile body)
6. Configurations that can be taken by present disclosure <General Description of Light Receiving Device and Distance Measuring Device of Present Disclosure>

In a light receiving device and a distance measuring device of the present disclosure, a protection circuit may include a clamping circuit that clamps an overvoltage to a certain voltage. Then, the clamping circuit may include: a resistance element of which one end is connected to a light receiving element; and a first clamping element connected between the other end of the resistance element and a reference potential node, and the first clamping element may include a clamping diode in which the cathode electrode is connected to the other end of the resistance element and the anode electrode is connected to the reference potential node.

In the light receiving device and the distance measuring device of the present disclosure including the preferred configuration described above, the clamping circuit may include a second clamping element provided between the first clamping element and the input end of a readout circuit, and the second clamping element may include a MOS transistor that is connected between the first clamping element and the input end of the readout circuit and in which the gate electrode is connected to the reference potential node.

Further, the light receiving device and the distance measuring device of the present disclosure including the preferred configurations described above may have a stacked chip structure in which at least two semiconductor substrates of a first semiconductor substrate and a second semiconductor substrate are stacked. Then, the light receiving element may be placed on the first semiconductor substrate, and the resistance element, the first clamping element, and the second clamping element may be placed on the second semiconductor substrate; alternatively the light receiving element and the resistance element may be placed on the first semiconductor substrate, and the first clamping element and the second clamping element may be placed on the second semiconductor substrate; or the light receiving element, the resistance element, and the first clamping element may be placed on the first semiconductor substrate, and the second clamping element may be placed on the second semiconductor substrate.

Further, in the light receiving device and the distance measuring device of the present disclosure including the preferred configurations described above, the protection circuit may include a resistance element connected between the light receiving element and the input end of the readout circuit. Then, when an N-type MOS transistor connected between the input end of the readout circuit and the reference potential node is provided, the resistance element included in the protection circuit may form a clamping circuit together with a body diode present in the N-type MOS transistor.

Further, in the light receiving device and the distance measuring device of the present disclosure including the preferred configurations described above, the first clamping element may include a MOS transistor of a diode-connected configuration. Alternatively, the first clamping element may include a second resistance element connected in series to the resistance element and a P-type MOS transistor connected between the output end of the second resistance element and the reference potential node, and the gate electrode of the P-type MOS transistor may be connected to a common connection node between the resistance element and the second resistance element.

Further, in the light receiving device and the distance measuring device of the present disclosure including the preferred configurations described above, the readout circuit may include a CMOS inverter circuit.

Further, in the light receiving device and the distance measuring device of the present disclosure including the preferred configurations described above, the light receiving element may be an element used by applying a voltage not less than the breakdown voltage. Further, the light receiving element may include an avalanche photodiode that operates in a Geiger mode.

Further, in the light receiving device and the distance measuring device of the present disclosure including the preferred configurations described above, the light receiving element preferably includes a single-photon avalanche diode. Then, the single-photon avalanche diode may be used by applying a negative bias voltage to the anode electrode or applying a positive bias voltage to the cathode electrode.

<Distance Measuring Device to which Technology According to Present Disclosure is Applied>

FIG. 1 is a schematic configuration diagram showing an example of a distance measuring device to which the technology according to the present disclosure is applied (that is, a distance measuring device of the present disclosure).

A distance measuring device 1 according to the present application example employs, as a measurement method of measuring the distance to a subject 10 that is a distance measurement target, a ToF method that measures the time of flight until light (for example, laser light having a peak wavelength in an infrared wavelength region) applied toward the subject 10 is reflected by the subject 10 and returns. In order to achieve distance measurement by the ToF method, the distance measuring device 1 according to the present application example includes a light source section 20 and a light receiving device 30. Then, as the light receiving device 30, a light receiving device according to an embodiment of the present disclosure described later may be used.

Specific Configuration Example of Distance Measuring Device

Figure 2B:
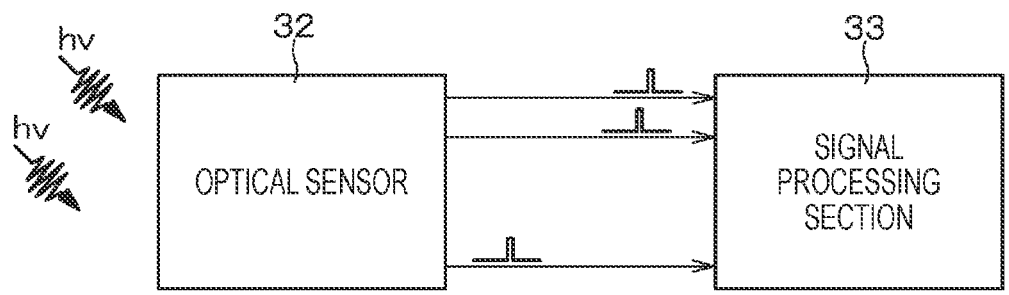

FIG. 2A and FIG. 2B show an example of a specific configuration of the distance measuring device 1 according to the present application example. The light source section 20 includes, for example, a laser driving section 21, a laser light source 22, and a diffusion lens 23, and applies laser light to the subject 10. The laser driving section 21 drives the laser light source 22 under the control of a control section 40. The laser light source 22 includes, for example, a semiconductor laser, and is driven by the laser driving section 21 to emit laser light. The diffusion lens 23 diffuses laser light emitted from the laser light source 22, and applies the laser light to the subject 10.

The light receiving device 30 includes a light receiving lens 31, an optical sensor 32 that is a light receiving section, and a signal processing section 33, and receives reflected laser light that returns after applied laser light from the light source section 20 is reflected by the subject 10. The light receiving lens 31 condenses reflected laser light from the subject 10 on a light receiving surface of the optical sensor 32. The optical sensor 32 receives reflected laser light from the subject 10 via the light receiving lens 31 in units of pixels, and performs photoelectric conversion. As the optical sensor 32, a two-dimensional array sensor in which pixels each including a light receiving element are two-dimensionally arranged in a matrix (array) form may be used.

An output signal of the optical sensor 32 is supplied to the control section 40 via the signal processing section 33. The control section 40 includes, for example, a central processing unit (CPU), etc.; and controls the light source section 20 and the light receiving device 30, and measures the time until laser light applied from the light source section 20 toward the subject 10 is reflected by the subject 10 and returns. The distance to the subject 10 can be obtained on the basis of the measured time.

As a time measurement method, a timer is started at the timing when pulsed light is applied from the light source section 20, and the timer is stopped at the timing when the light receiving device 30 receives the pulsed light; thus, the time is measured. As another method of time measurement, pulsed light may be applied from the light source section 20 at a predetermined period and the period when the light receiving device 30 receives the pulsed light may be detected, and the time may be measured from the phase difference between the period of the emitted light and the period of the received light. The time measurement is executed multiple times, and the time is measured by detecting the position of the peak of a ToF histogram in which periods of time obtained by the multiple times of measurement are accumulated.

Then, in the distance measuring device 1 according to the present application example, a sensor in which a light receiving element of a pixel includes an element that generates a signal in response to reception of a photon, for example a single-photon avalanche diode (SPAD) element, is used as the optical sensor 32. That is, in the light receiving device 30 in the distance measuring device 1 according to the present application example, a SPAD element is used as the light receiving element of the pixel. The SPAD element operates in a Geiger mode in which the element is operated at a reverse voltage exceeding the breakdown voltage (yield voltage).

Note that although herein a SPAD element is given as an example of the light receiving element (light detecting element) of the pixel, the light receiving element is not limited to a SPAD element. That is, as the light receiving element of the pixel, various elements that operate in a Geiger mode, such as an avalanche photodiode (APD) and a silicon photomultiplier (SiPM), may be used as well as a SPAD element.

[Basic Pixel Circuit Example Using SPAD Element]

Figure 3:
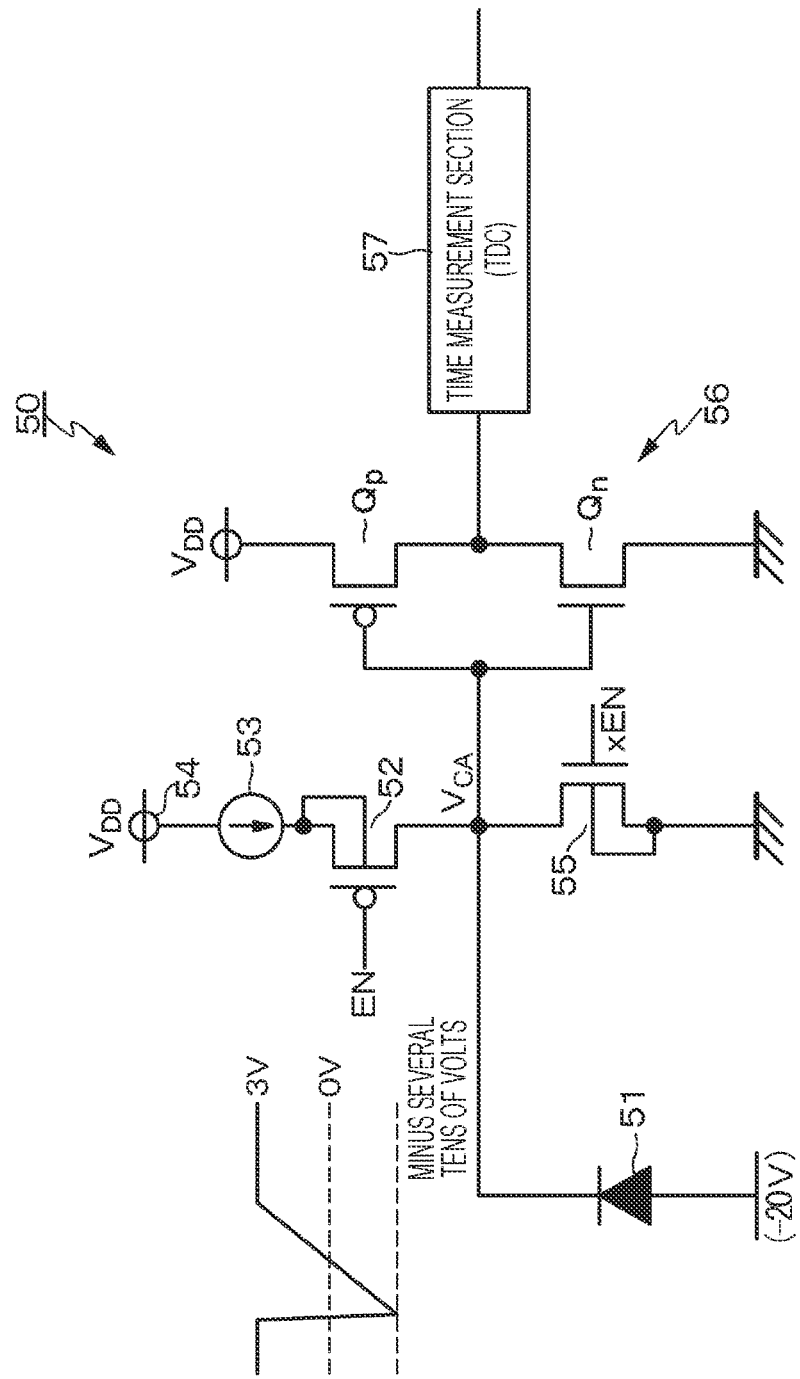
FIG. 3 is a circuit diagram showing an example of a configuration of a basic pixel circuit using a SPAD element.

FIG. 3 shows an example of a configuration of a basic pixel circuit in the light receiving device 30 using a SPAD element. Herein, a basic configuration for one pixel is illustrated.

In a basic pixel circuit of a pixel 50 using a SPAD element, the cathode electrode of a SPAD element 51 is, via a first control transistor 52 and a current source 53, connected to a terminal 54 to which a power supply voltage $V_{DD}$ is applied. Examples of the power supply voltage $V_{DD}$ include a voltage of about 3 V. An anode voltage $V_{ano}$ is applied to the anode electrode of the SPAD element 51. As the anode voltage $V_{ano}$, a large negative voltage at which avalanche multiplication occurs, that is, a voltage not less than the breakdown voltage (for example, about −20 V) is applied (see FIG. 4B).

The first control transistor 52 includes, for example, a P-type MOS transistor; and enters a conduction state by an enable signal EN applied to the gate electrode becoming a low level, and passes a current from the current source 53 to the SPAD element 51. A second control transistor 55 is connected between the cathode electrode of the SPAD element 51 and a reference potential node (for example, the ground). The second control transistor 55 includes, for example, an N-type MOS transistor; and enters a conduction state by a signal xEN in antiphase with the enable signal EN being applied to the gate electrode, sets the voltage applied to the SPAD element 51 to not more than the breakdown voltage, and brings the SPAD element 51 into a deactivated state.

A signal generated by the SPAD element 51 in response to reception of a photon is read out by a readout circuit 56 as a cathode potential $V_{CA}$. The readout circuit 56 includes, for example, a CMOS inverter circuit including a P-type MOS transistor $Q_p$ and an N-type MOS transistor $Q_n$, and detects a reaction edge of the SPAD element 51. An output of the readout circuit 56 is supplied to a time measurement section (time-to-digital converter, TDC) 57 as a SPAD output (pixel output). On the basis of a SPAD output, the time measurement section 57 measures the time until light applied toward a measurement target is reflected by the measurement target and returns.

As described above, a voltage (for example, about −20 V) not less than the breakdown voltage $V_{BD}$ is applied to the SPAD element 51. An excess voltage added on the breakdown voltage Van is called an excess bias voltage $V_{EX}$. The characteristics of the SPAD element 51 change depending on how large a voltage value of excess bias voltage $V_{EX}$ is applied with respect to the voltage value of the breakdown voltage $V_{BD}$.

Figure 4A:
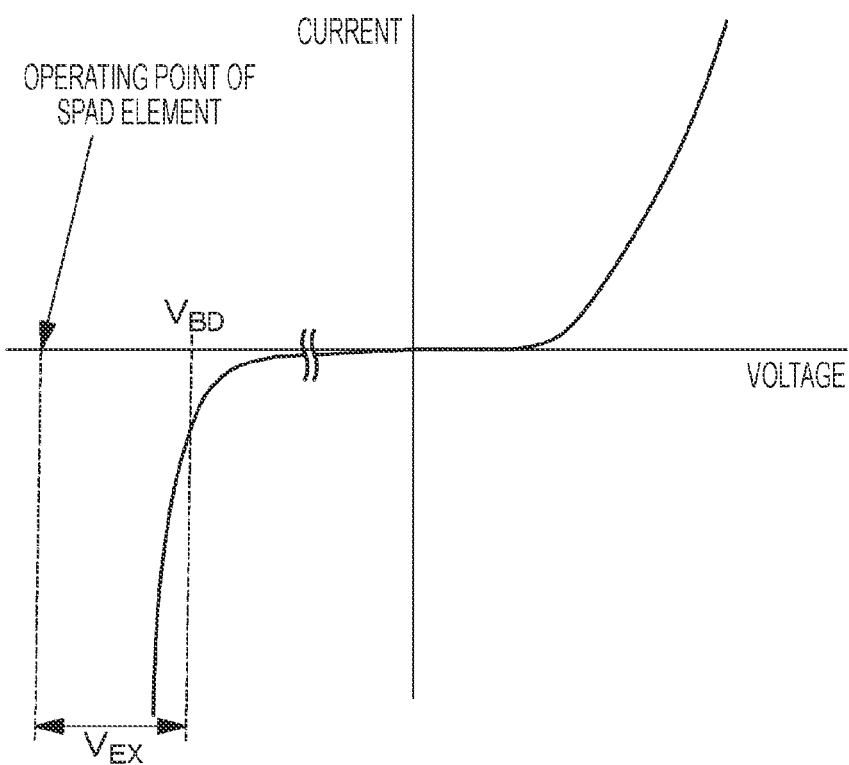
FIG. 4A is a characteristic diagram showing current-voltage characteristics of a PN junction of a SPAD element.

FIG. 4A shows I (current)-V (voltage) characteristics of the PN junction of the SPAD element 51 that operates in a Geiger mode. FIG. 4A shows relationships among the breakdown voltage $V_{BD}$, the excess bias voltage $V_{EX}$, and the operating point of the SPAD element 51.

[Circuit Operation Example of Pixel Circuit Using SPAD Element]

Figure 4B:
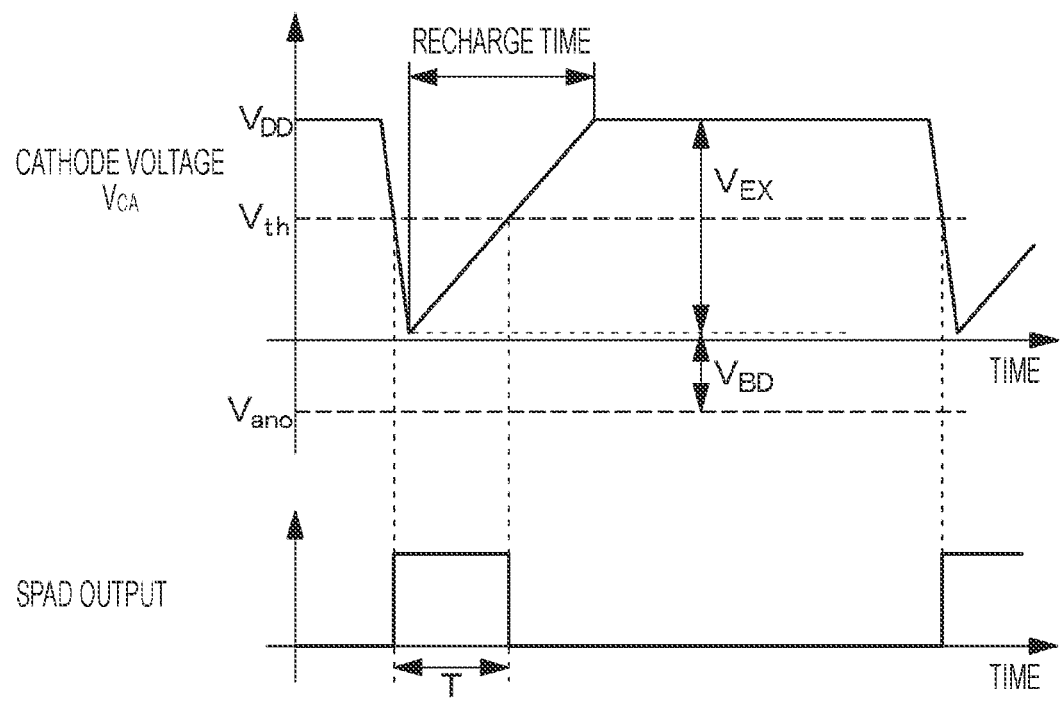
FIG. 4B is a waveform diagram for describing a circuit operation of a pixel circuit.

Next, an example of a circuit operation of a pixel circuit of the above configuration is described using the waveform diagram of FIG. 4B.

In a state where no current flows through the SPAD element 51, a voltage of a value of ($V_{DD}$−$V_{ano}$) is applied to the SPAD element 51. This voltage value ($V_{DD}$−$V_{ano}$) is ($V_{BD}$+$V_{EX}$). Then, an electron generated due to a dark electron generation rate DCR (dark count rate) or light irradiation at the PN junction of the SPAD element 51 causes avalanche multiplication, and an avalanche current occurs. This phenomenon stochastically occurs even in a light-shielded state (that is, a state where light is not incident). This is the rate of dark electron generation, that is, a dark count rate (DCR).

If the cathode potential $V_{CA}$ lowers and the voltage between the terminals of the SPAD element 51 reaches the breakdown voltage $V_{BD}$ of the PN diode, the avalanche current stops. Then, electrons generated by avalanche multiplication and accumulated are discharged through a load 54 (for example, a P-type MOS transistor $Q_L$), and the cathode potential $V_{CA}$ rises. Then, the cathode potential $V_{CA}$ recovers to the power supply voltage $V_{DD}$, and the state returns to the initial state again.

If light is incident on the SPAD element 51 and any electron-hole pair at all is generated, the electron-hole pair serves as a seed and an avalanche current occurs; therefore, even incidence of one photon can be detected with certain detection efficiency, i.e., photon detection efficiency (PDE).

The above operation is repeated. Then, in this series of operations, the cathode potential $V_{CA}$ is subjected to waveform shaping in the readout circuit 56 including a CMOS inverter circuit, and a pulse signal having a pulse width T with the arrival time of one photon as a start point is outputted as a SPAD output (pixel output).

[Stacked Chip Structure of Light Receiving Device]

Figure 5:
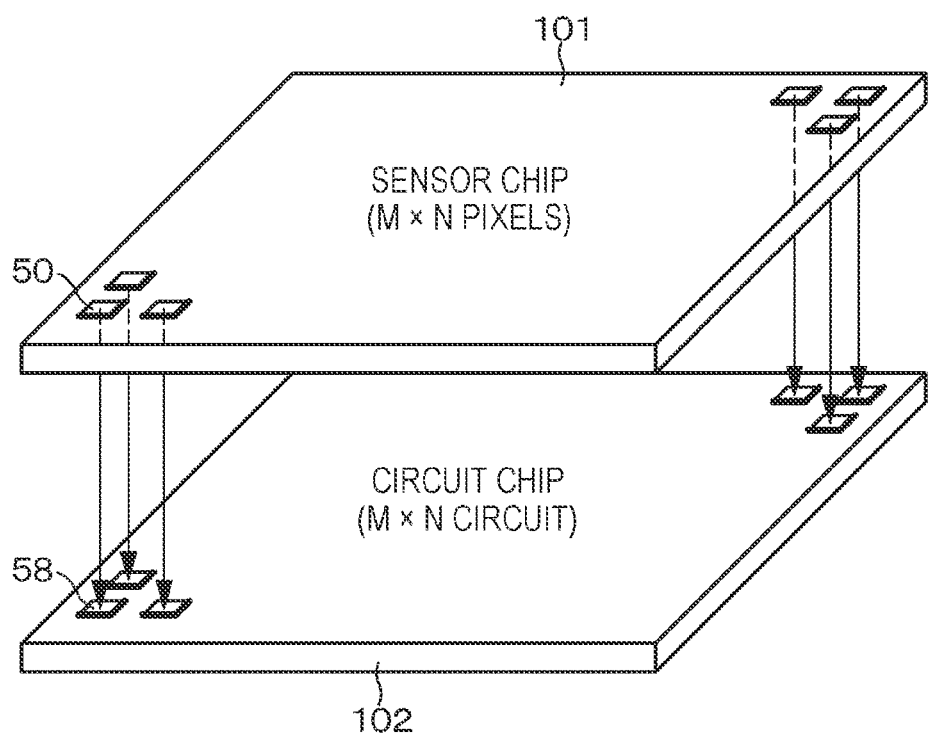
FIG. 5 is an exploded perspective view of a stacked chip structure of a sensor chip and a circuit chip of a light receiving device.

The chip structure of the light receiving device 30 may be what is called a stacked chip structure in which at least two semiconductor substrates of a first semiconductor substrate and a second semiconductor substrate are stacked. As shown in FIG. 5, pixels 50 each including the SPAD element 51 are arranged on the first semiconductor substrate in a two-dimensional array form of M rows and N columns to form a pixel array section. The first semiconductor substrate in which the pixels 50 are arranged forms a sensor chip 101. The sensor chip 101 corresponds to the optical sensor 32 of FIG. 2A.

A circuit section 58 is provided for each pixel 50. The pixel 50 includes at least the SPAD element 51. The circuit section 58 includes, for example, the first control transistor 52, the current source 53, the second control transistor 55, the readout circuit 56, and the time measurement section 57 shown in FIG. 3, etc. The circuit sections 58 are arranged on the second semiconductor substrate in a two-dimensional array form of M rows and N columns, corresponding to each of the pixels 50.

The second semiconductor substrate in which the circuit sections 58 are arranged forms a circuit chip 102. The circuit chip 102 is stacked on the sensor chip 101. Thus, in a stacked chip structure of the sensor chip 101 and the circuit chip 102, the circuit section 58 is provided for each pixel 50.

[Overvoltage Applied to Readout Circuit of SPAD Element]

In the case of the above example, the readout circuit 56 that detects a reaction edge of the SPAD element 51 is directly connected to the cathode electrode of the SPAD element 51, and has a circuit configuration capable of detecting a change in amplitude of voltage set as a Geiger mode (for example, about 3 V) in a case where reflected light is detected.

Figure 6A:
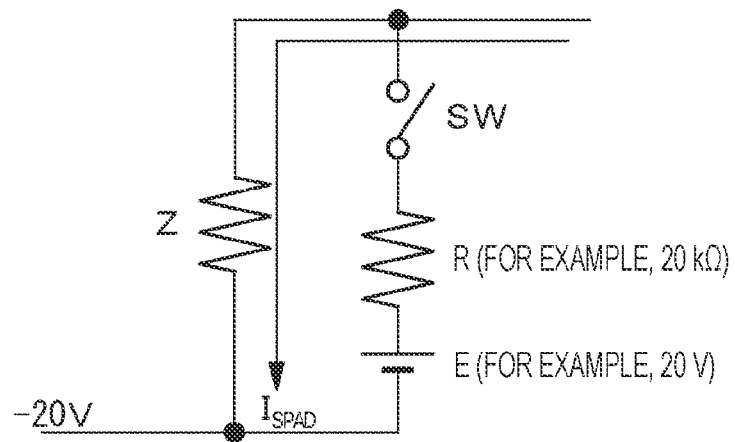
FIG. 6A is an equivalent circuit diagram showing a breakdown model and a photoelectric conversion model of a SPAD element.
Figure 6B:
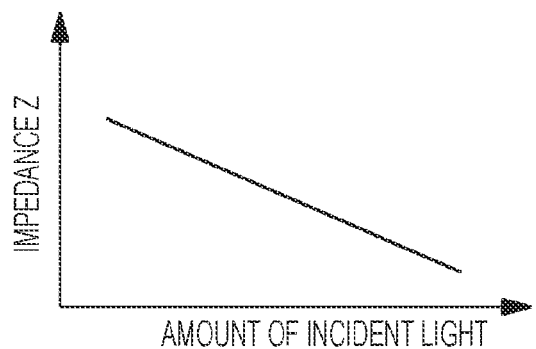
FIG. 6B is a diagram showing a change in internal impedance of a SPAD element with respect to the amount of incident light.
Figure 6C:
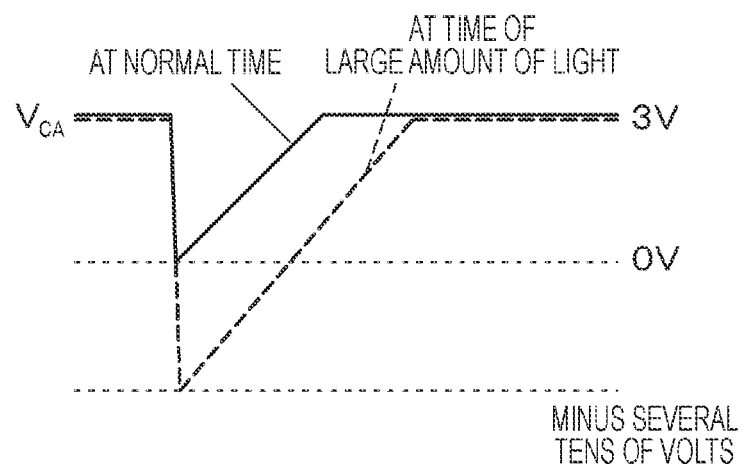
FIG. 6C is a waveform diagram showing cathode potentials $V_{CA}$ at a normal time and at the time of a large amount of light.

Here, a case where the SPAD element 51 is irradiated with a large amount of laser light not less than a predetermined amount of light (not less than expected), such as a case where the SPAD element 51 is directly irradiated with laser light, is described using FIG. 6A, FIG. 6B, and FIG. 6C.

FIG. 6A is an equivalent circuit diagram showing a breakdown model and a photoelectric conversion model of the SPAD element 51, FIG. 6B is a diagram showing a change in internal impedance of the SPAD element 51 with respect to the amount of incident light, and FIG. 6C is a waveform diagram showing the cathode potential $V_{CA}$ at a normal time (the solid line) and at the time of a large amount of light (the broken line).

In the equivalent circuit diagram shown in FIG. 6A, the model of a series circuit of a switch SW, a resistance R, and a voltage source E is a SPAD breakdown model; herein, a model in which the resistance R of the SPAD element 51 is 20 kA and the voltage source E is 20 V is illustrated as an example. In the SPAD breakdown model, the amount-of-light dependence is small; in the case of a normal amount of light not more than a predetermined amount of light, the cathode potential $V_{CA}$ is determined by this SPAD breakdown model.

The photoelectric conversion model is a model in which a photocurrent $I_{SPAD}$ flows from the second control transistor 55 (see FIG. 3) through the internal impedance Z. In this photoelectric conversion model, as shown in FIG. 6B, the internal impedance Z is high at a normal time when an amount of laser light not more than a predetermined amount of light is applied, but if the SPAD element 51 is irradiated with a large amount of laser light exceeding the predetermined amount of light, the internal impedance Z of the SPAD element 51 lowers.

According to an evaluation by the inventors of the present application, for example, it has been found that the internal impedance Z of the SPAD element 51 lowers to about 100Ω at a large amount of light of about 500 kW/cm$^2$ and at this time the cathode potential $V_{CA}$ may become a high potential of −10 V or more on calculation.

Thus, in a case where the SPAD element 51 is irradiated with a large amount of laser light, the SPAD element 51 is strongly affected by photoelectric conversion due to a large amount of light, and consequently the internal impedance Z greatly lowers. As a result, as shown in FIG. 6C, an excessive voltage (for example, about several tens of volts) is applied to the readout circuit 56, and element breaking of circuit elements included in the readout circuit 56 may be caused. Specifically, due to an excessive voltage being applied, the P-type MOS transistor $Q_p$ and the N-type MOS transistor $Q_n$ included in the readout circuit 56 or the first control transistor 52 or the second control transistor 55 may be broken.

<Light Receiving Device According to Embodiment of Present Disclosure>

Figure 7:
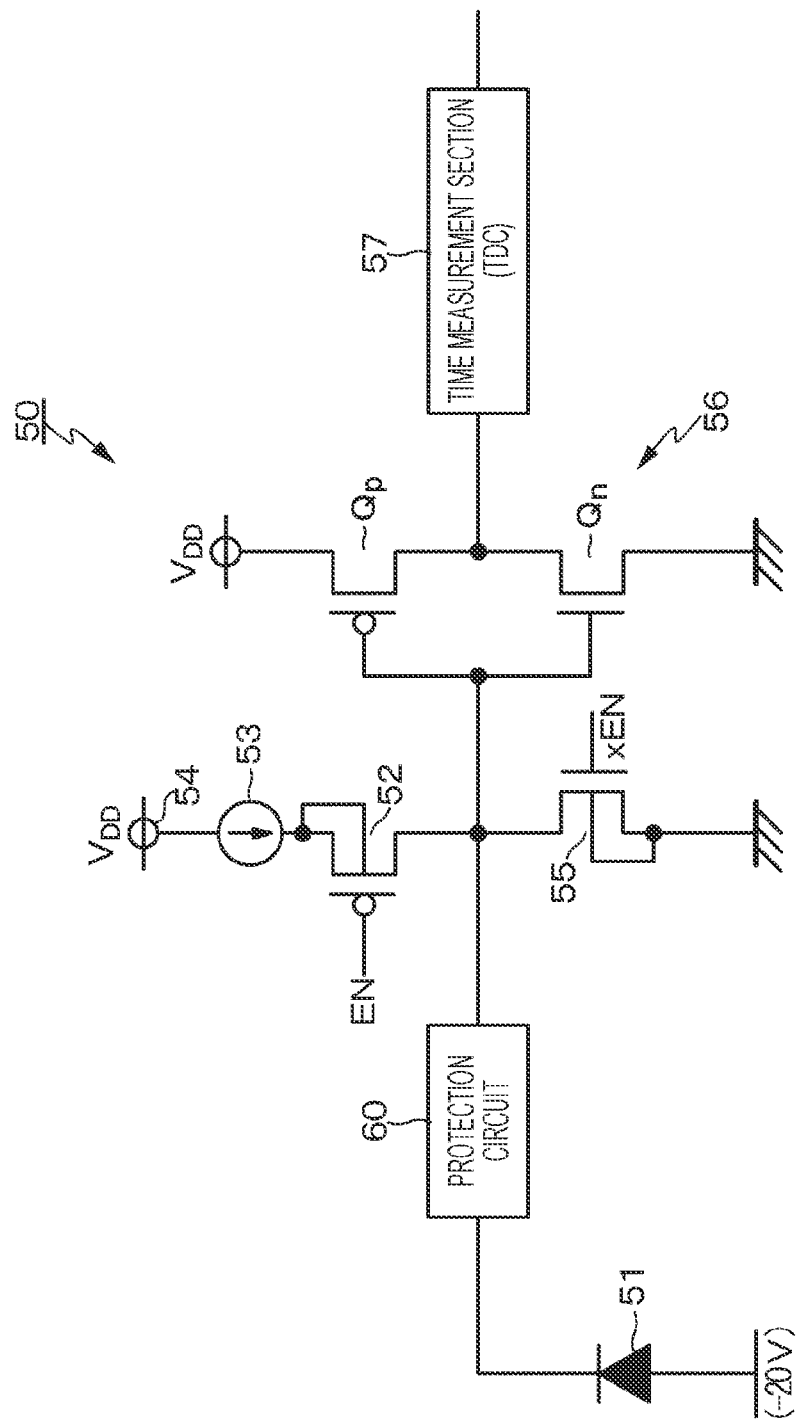
FIG. 7 is a circuit diagram showing a configuration example of a light receiving device according to an embodiment of the present disclosure.

FIG. 7 is a block diagram showing a configuration example of a light receiving device according to an embodiment of the present disclosure. As shown in FIG. 7, in the present embodiment, in a light receiving device including the SPAD element 51 that generates a signal in response to reception of a photon and the readout circuit 56 that reads out a signal generated by the SPAD element 51, a protection circuit 60 is provided between the SPAD element 51 and the input end of the readout circuit 56.

The protection circuit 60 is an overvoltage protection circuit that has an action that protects the P-type MOS transistor $Q_p$ and the N-type MOS transistor $Q_n$ included in the readout circuit 56 and the first control transistor 52 and the second control transistor 55 from an overvoltage occurring when the SPAD element 51 is irradiated with a large amount of laser light.

Thus, by providing the protection circuit 60 between the SPAD element 51 and the input end of the readout circuit 56, even in a case where the SPAD element 51 is irradiated with a large amount of laser light not less than a predetermined amount of light (not less than expected), the P-type MOS transistor $Q_p$ and the N-type MOS transistor $Q_n$ included in the readout circuit 56 and the first control transistor 52 and the second control transistor 55 can be protected from overvoltage by the action of the protection circuit 60.

Hereinbelow, specific Examples of the protection circuit 60 for protecting circuit elements included in the readout circuit 56, etc. from overvoltage are described.

Example 1

Figure 8:
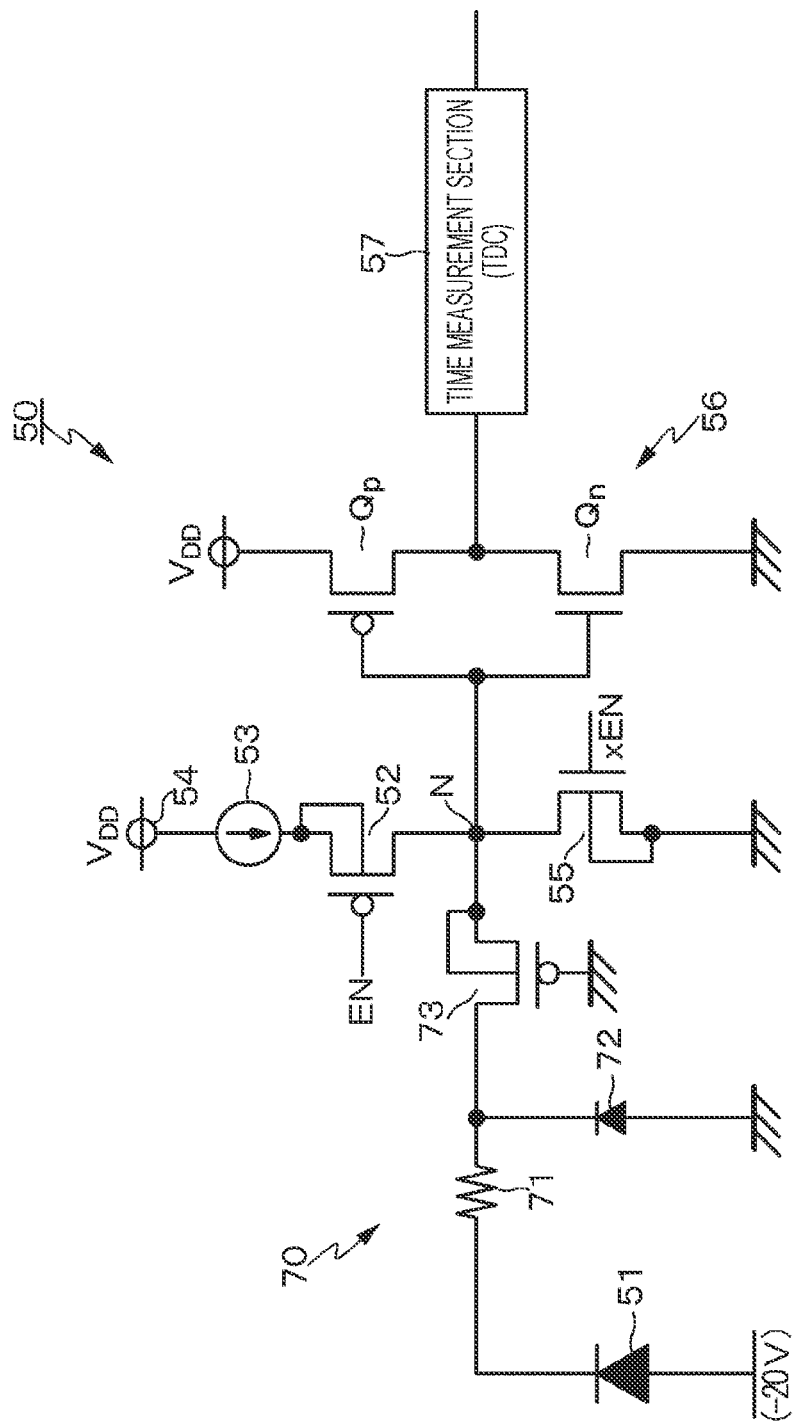
FIG. 8 is a circuit diagram showing a configuration example of a light receiving device according to Example 1.

Example 1 is an example of a negative bias configuration, and is an example in which the protection circuit 60 includes a clamping circuit. FIG. 8 shows a circuit diagram of a configuration example of the light receiving device 30 according to Example 1.

The light receiving device 30 according to Example 1 has a negative bias configuration in which a negative bias voltage (for example, about −20 V) is applied to the anode electrode of the SPAD element 51, and has a configuration in which a clamping circuit 70 that clamps an overvoltage to a certain voltage is used as the protection circuit 60. That is, in the light receiving device 30 according to Example 1, the protection circuit 60 includes the clamping circuit 70 that clamps an overvoltage to a certain voltage.

As shown in FIG. 8, the clamping circuit 70 includes a resistance element 71, a first clamping element 72, and a second clamping element 73. One end of the resistance element 71 is connected to the cathode electrode of the SPAD element 51. The first clamping element 72 includes, for example, a clamping diode, and the cathode electrode is connected to the other end (output end) of the resistance element 71 and the anode electrode is connected to the reference potential node (for example, the ground).

The resistance element 71 is provided so that when an overvoltage occurs in the SPAD element 51, the value of current flowing through the clamping diode that is the first clamping element 72 is limited not to exceed the rated forward current of the clamping diode. When an overvoltage exceeding the clamping voltage occurs in the SPAD element 51, the clamping diode that is the first clamping element 72 clamps the overvoltage to a certain voltage (forward voltage $V_F$).

Note that the first clamping element 72 is not limited to a clamping diode. For example, as well as a clamping diode, examples of the first clamping element 72 may include a Schottky barrier diode and the like.

The second clamping element 73 includes, for example, a P-type MOS transistor, and is connected between the first clamping element 72 (specifically, the anode electrode of the clamping diode) and a node N to which the input end of the readout circuit 56 is connected. In the P-type MOS transistor that is the second clamping element 73, the gate electrode is connected to the reference potential node (for example, the ground), and the back gate is connected to the source electrode.

Figure 9:
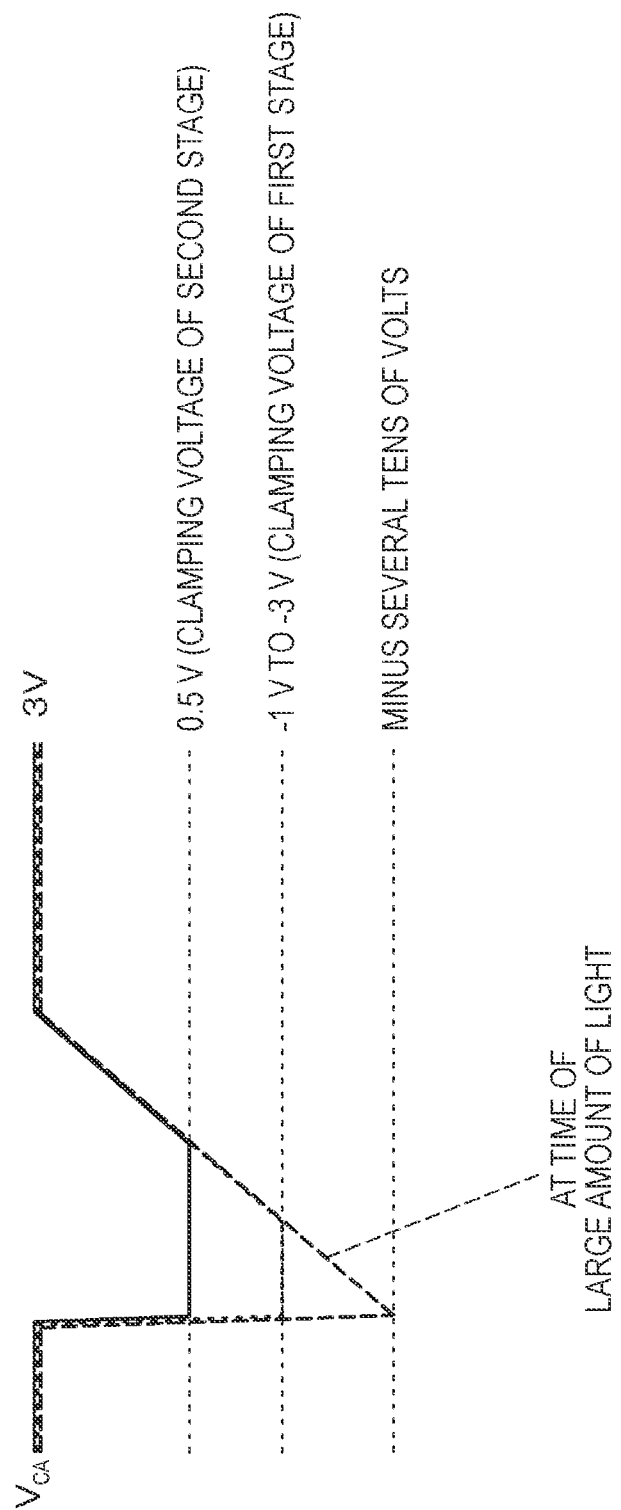
FIG. 9 is a waveform diagram describing a clamping operation when an overvoltage occurs in the light receiving device according to Example 1.

Here, as an example, a clamping operation in a case where an overvoltage of minus several tens of volts occurs in the SPAD element 51 is described using the waveform diagram of FIG. 9. The clamping diode that is the first clamping element 72 clamps an overvoltage that has occurred in the SPAD element 51 to a certain voltage (forward voltage $V_F$). By this clamping operation, the overvoltage that has occurred in the SPAD element 51 is clamped to, for example, a negative voltage of about −1 V to −3 V.

Here, based on the fact that a negative voltage occurs by the clamping operation by the first clamping element 72, the negative voltage may exceed the breakdown voltage of a MOS transistor in a later stage. To address the problem of this negative voltage, the second clamping element 73 is provided. That is, the second clamping element 73 clamps the voltage of the node N to which the input end of the readout circuit 56 is connected to the gate-source voltage $V_{gs}$ of the P-type MOS transistor (for example, about 0.5 V). Thus, the problem of the negative voltage can be solved by the clamping operation by the first clamping element 72.

As described above, by using the light receiving device 30 of Example 1, an overvoltage occurring due to the SPAD element 51 being irradiated with a large amount of light not less than a predetermined amount of light can be clamped to a certain voltage by the action of the clamping circuit 70 provided as the protection circuit 60. As a result, the P-type MOS transistor $Q_p$ and the N-type MOS transistor $Q_n$ included in the readout circuit 56 and the first control transistor 52 and the second control transistor 55 can be protected from overvoltage.

Next, variations of element arrangement of the SPAD element 51, the resistance element 71, the first clamping element 72, and the second clamping element 73 in a case where the light receiving device 30 according to Example 1 of the above configuration has a stacked chip structure (see FIG. 5) in which the sensor chip 101 and the circuit chip 102 are stacked as an upper chip and a lower chip are described.

Element Arrangement Example 1

Figure 10:
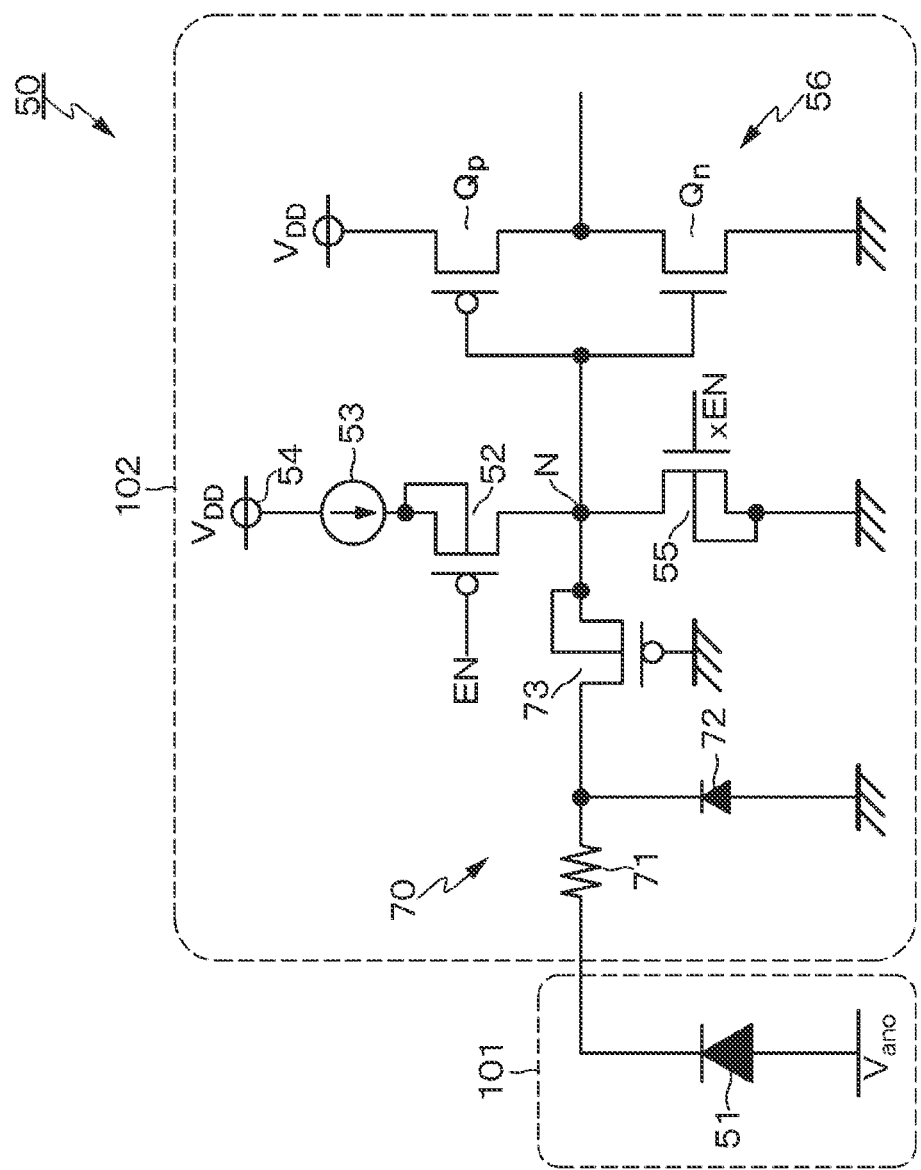
FIG. 10 is a circuit diagram showing element arrangement example 1 of a SPAD element, a resistance element, a first clamping element, and a second clamping element in a stacked chip structure.

FIG. 10 is a circuit diagram showing element arrangement example 1 of the SPAD element 51, the resistance element 71, the first clamping element 72, and the second clamping element 73 in a stacked chip structure.

In the stacked chip structure according to element arrangement example 1, only the SPAD element 51 is placed on the sensor chip 101, which is the upper chip, and the resistance element 71, the first clamping element 72, and the second clamping element 73, and the first control transistor 52, the current source 53, the second control transistor 55, and the readout circuit 56 are placed on the circuit chip 102, which is the lower chip.

Element Arrangement Example 2

Figure 11:
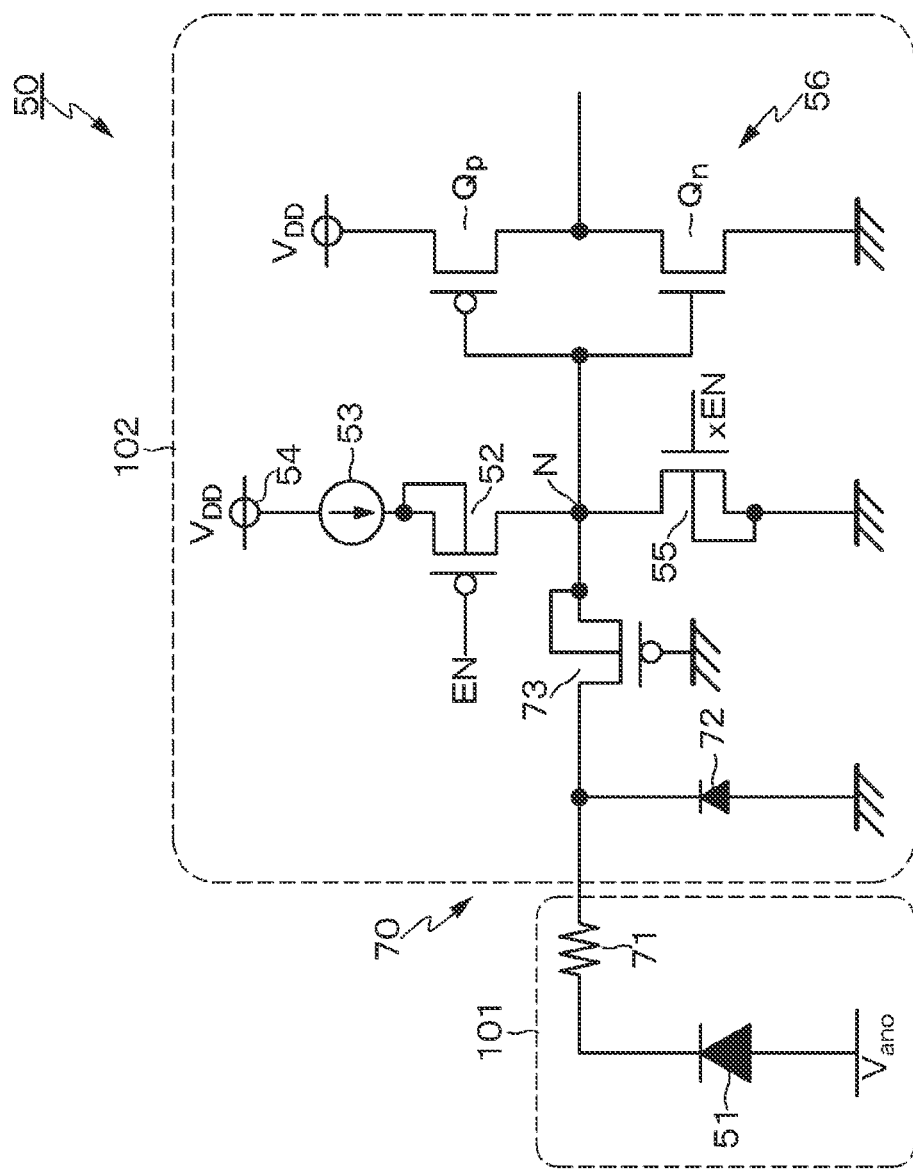
FIG. 11 is a circuit diagram showing element arrangement example 2 of a SPAD element, a resistance element, a first clamping element, and a second clamping element in a stacked chip structure.

FIG. 11 is a circuit diagram showing element arrangement example 2 of the SPAD element 51, the resistance element 71, the first clamping element 72, and the second clamping element 73 in a stacked chip structure.

In the stacked chip structure according to element arrangement example 2, the SPAD element 51 and the resistance element 71 are placed on the sensor chip 101, which is the upper chip, and the first clamping element 72 and the second clamping element 73, and the first control transistor 52, the current source 53, the second control transistor 55, and the readout circuit 56 are placed on the circuit chip 102, which is the lower chip.

Element Arrangement Example 3

Figure 12:
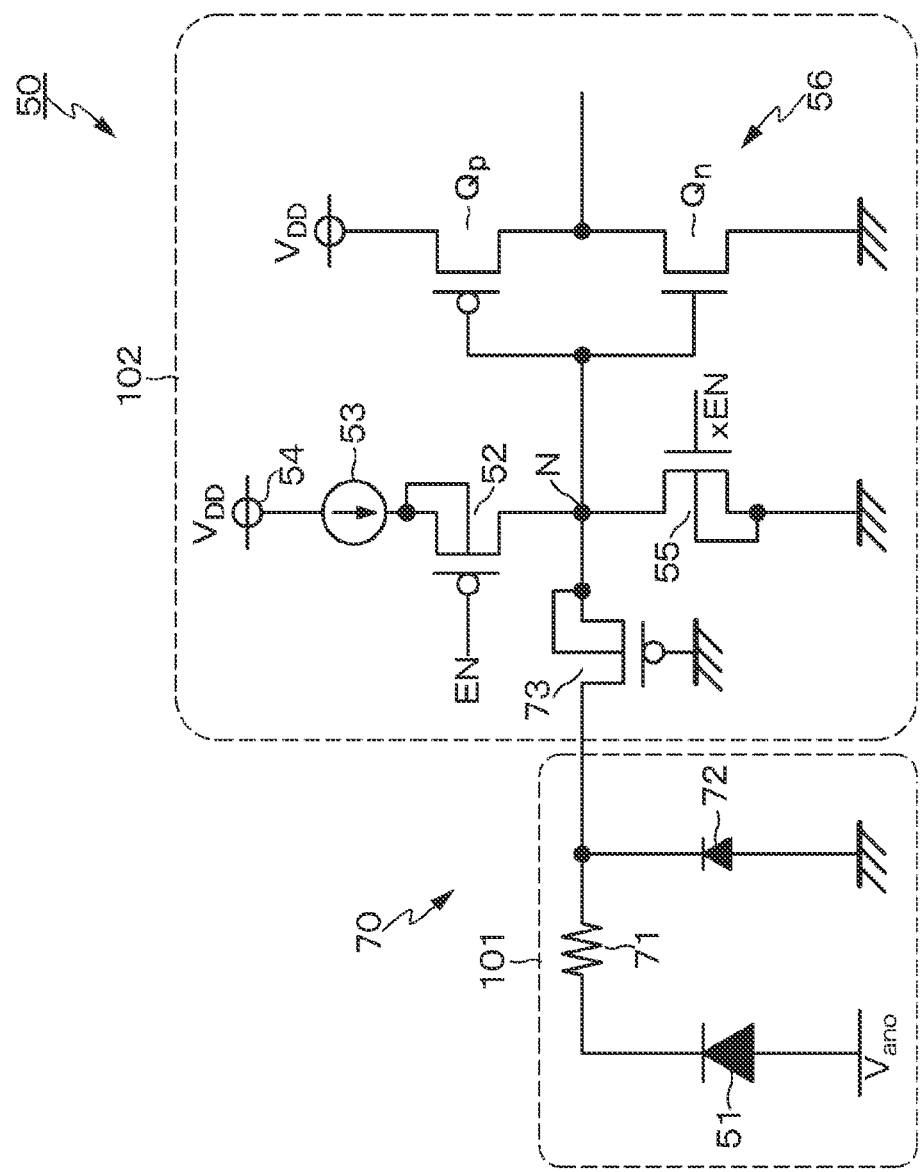
FIG. 12 is a circuit diagram showing element arrangement example 3 of a SPAD element, a resistance element, a first clamping element, and a second clamping element in a stacked chip structure.

FIG. 12 is a circuit diagram showing element arrangement example 3 of the SPAD element 51, the resistance element 71, the first clamping element 72, and the second clamping element 73 in a stacked chip structure.

In the stacked chip structure according to element arrangement example 3, the SPAD element 51, the resistance element 71, and the first clamping element 72 are placed on the sensor chip 101, which is the upper chip, and the second clamping element 73, and the first control transistor 52, the current source 53, the second control transistor 55, and the readout circuit 56 are placed on the circuit chip 102, which is the lower chip.

Example 2

Figure 13:
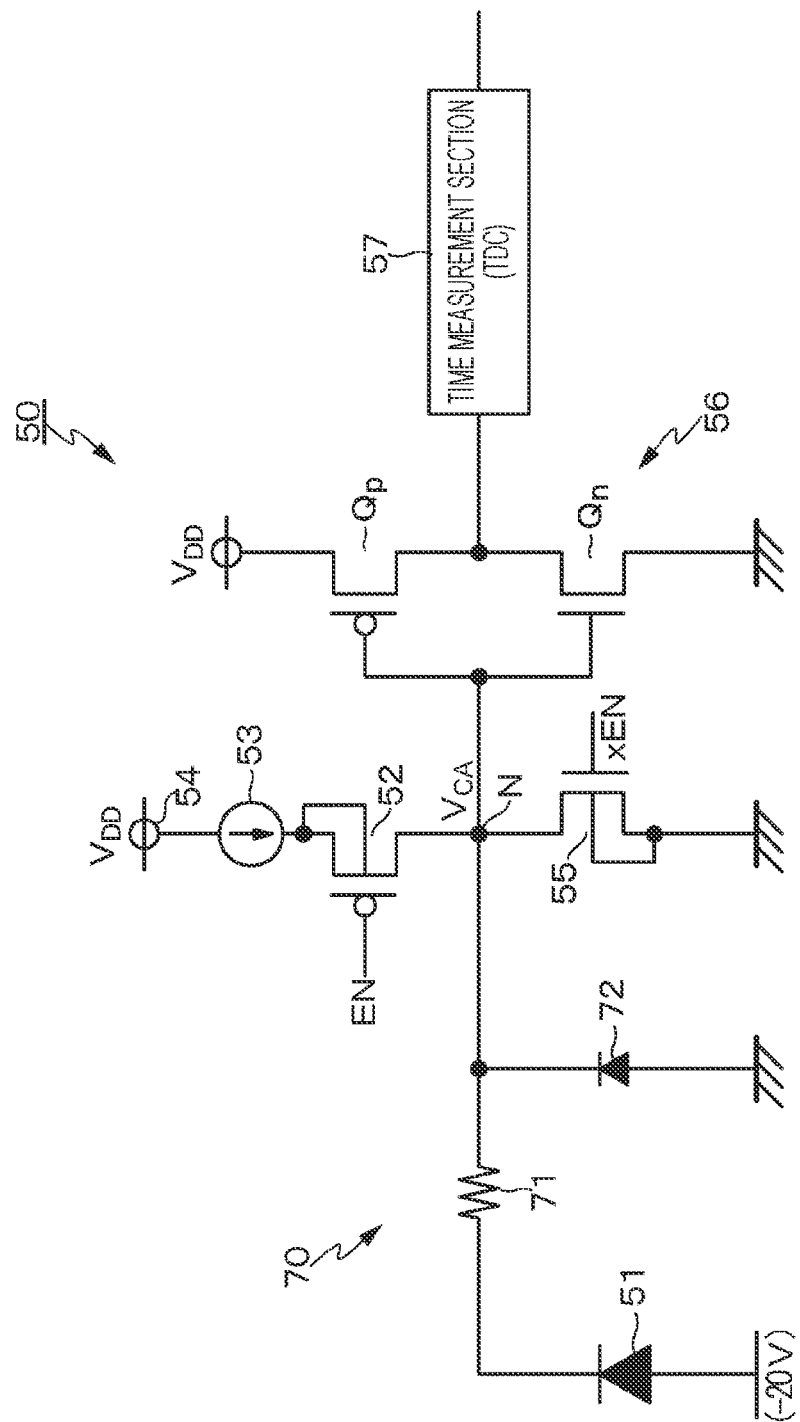
FIG. 13 is a circuit diagram showing a configuration example of a light receiving device according to Example 2.

Example 2 is a modification example of Example 1, and is an example in which the second clamping element is omitted. FIG. 13 shows a circuit diagram of a configuration example of the light receiving device 30 according to Example 2.

In the light receiving device 30 according to Example 2, the clamping circuit 70 includes the resistance element 71 and the first clamping element 72. That is, in the light receiving device 30 according to Example 2, the second clamping element 73, which is used as a constituent element of the clamping circuit 70 in Example 1, is omitted.

In the case of the light receiving device 30 according to Example 2 of the above configuration, the action and effect by the second clamping element 73 of Example 1 cannot be obtained, and the voltage of the node N becomes a negative voltage; however, this voltage is much lower than overvoltage (minus several tens of volts). Therefore, even in a case where the SPAD element 51 is irradiated with a large amount of light not less than a predetermined amount of light and an overvoltage occurs, the P-type MOS transistor $Q_p$ and the N-type MOS transistor $Q_n$ included in the readout circuit 56 and the first control transistor 52 and the second control transistor 55 can be protected from overvoltage.

Example 3

Figure 14:
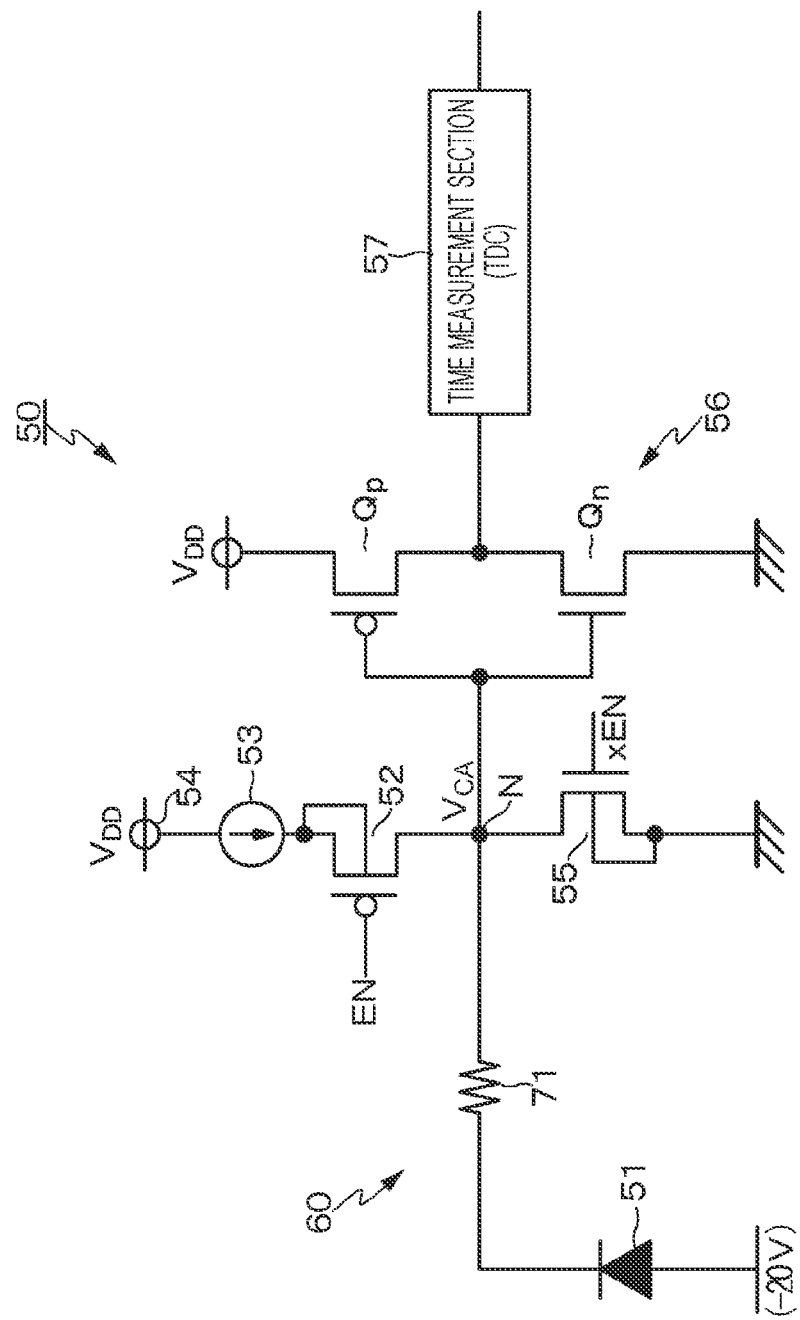
FIG. 14 is a circuit diagram showing a configuration example of a light receiving device according to Example 3.

Example 3 is an example of a negative bias configuration, and is an example in which the protection circuit 60 includes a resistance element. FIG. 14 shows a circuit diagram of a configuration example of the light receiving device 30 according to Example 3.

In the light receiving device 30 according to Example 3, the protection circuit 60 includes the resistance element 71 connected between the SPAD element 51 and the input end of the readout circuit 56, that is, the node N. That is, in the light receiving device 30 according to Example 3, the first clamping element 72 and the second clamping element 73, which are used as constituent elements of the clamping circuit 70 in Example 1, are omitted.

In the light receiving device 30 according to Example 3, the resistance element 71 forms a clamping circuit together with a body diode present in the N-type MOS transistor that is connected as the second control transistor 55 between the node N to which the input end of the readout circuit 56 is connected and the reference potential node (for example, the ground). Here, the "body diode" is a built-in diode formed by a PN junction between the source and the drain due to the structure of the MOSFET.

By using the light receiving device 30 according to Example 3 of the above configuration, when the SPAD element 51 is irradiated with a large amount of light not less than a predetermined amount of light and an overvoltage occurs, a voltage much lower than overvoltage (minus several tens of volts) is applied to the node N by virtue of a voltage drop by the resistance element 71 and a clamping action by the body diode of the N-type MOS transistor. Therefore, even in a case where the SPAD element 51 is irradiated with a large amount of light not less than a predetermined amount of light and an overvoltage occurs, the P-type MOS transistor $Q_p$ and the N-type MOS transistor $Q_n$ included in the readout circuit 56 and the first control transistor 52 and the second control transistor 55 can be protected from overvoltage.

Example 4

Figure 15:
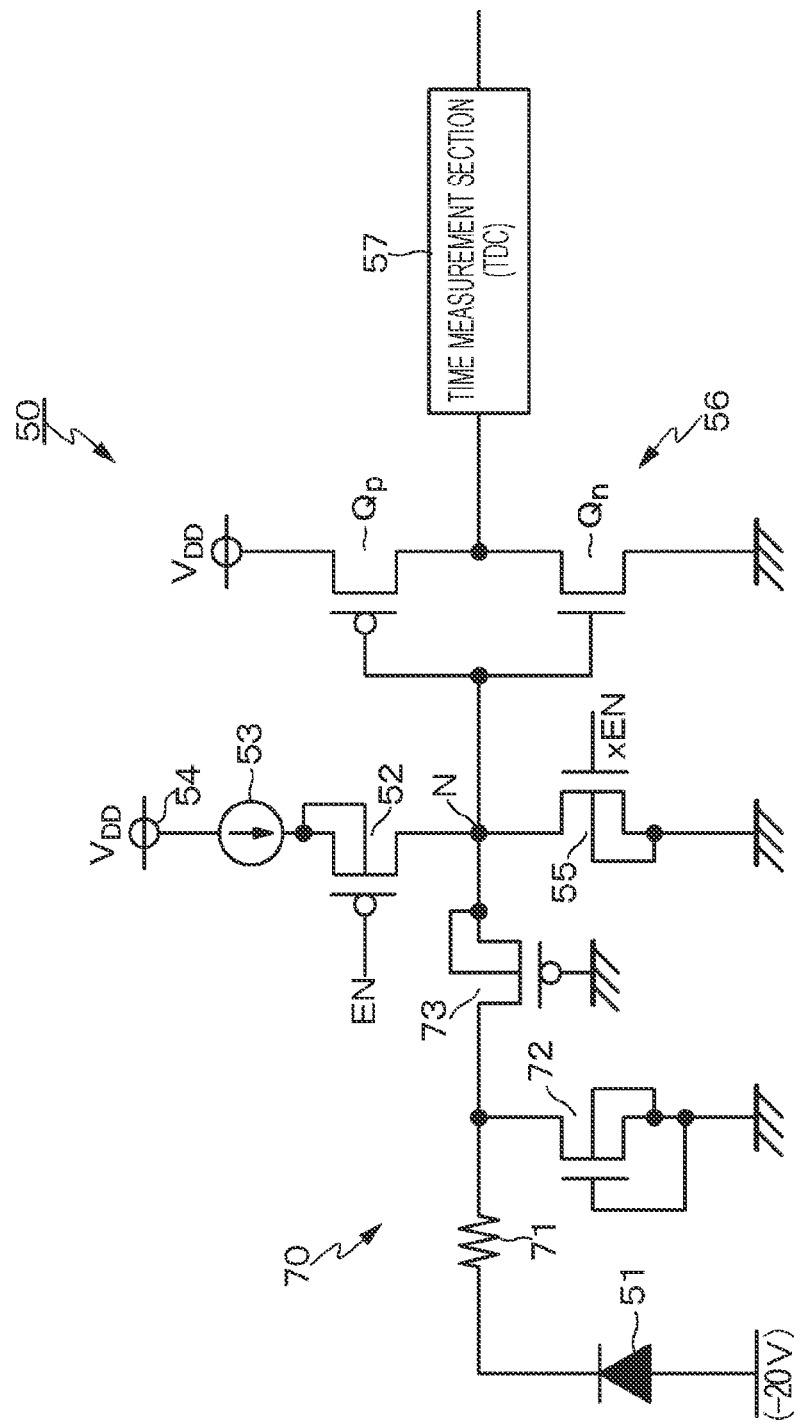
FIG. 15 is a circuit diagram showing a configuration example of a light receiving device according to Example 4.

Example 4 is a modification example of Example 1, and is an example in which the first clamping element 73 is configured by using an N-type MOS transistor of a diode-connected configuration. FIG. 15 shows a circuit diagram of a configuration example of the light receiving device 30 according to Example 4.

In the light receiving device 30 according to Example 4, in the clamping circuit 70 including the resistance element 71, the first clamping element 72, and the second clamping element 73, the first clamping element 72 includes an N-type MOS transistor. The N-type MOS transistor is connected between the other end (output end) of the resistance element 71 and the reference potential node (for example, the ground), and has a diode-connected configuration in which the gate electrode and the drain electrode are connected in common.

As described above, in the light receiving device 30 according to Example 4, an N-type MOS transistor of a diode-connected configuration is used as the first clamping element 72 included in the clamping circuit 70 in place of the clamping diode of Example 1. Thus, even with the configuration in which an N-type MOS transistor of a diode-connected configuration is used as the first clamping element 72, similar action and effect to those in the case of Example 1 can be obtained, that is, when the SPAD element 51 is irradiated with a large amount of light not less than a predetermined amount of light and an overvoltage occurs, circuit elements such as the readout circuit 56 in a later stage can be protected from overvoltage.

Example 5

Figure 16:
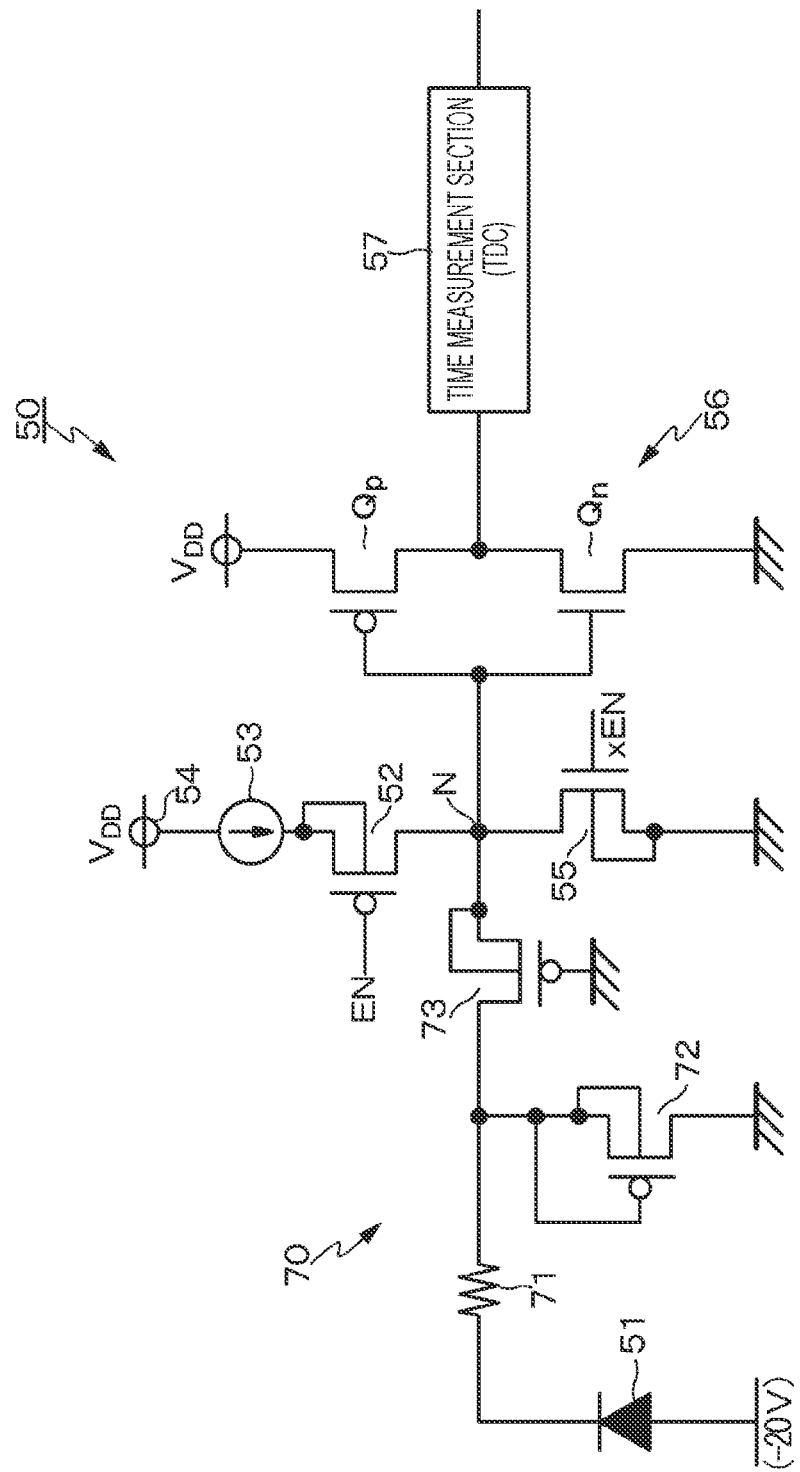
FIG. 16 is a circuit diagram showing a configuration example of a light receiving device according to Example 5.

Example 5 is a modification example of Example 1, and is an example in which the first clamping element 73 is configured by using a P-type MOS transistor of a diode-connected configuration. FIG. 16 shows a circuit diagram of a configuration example of the light receiving device 30 according to Example 5.

In the light receiving device 30 according to Example 5, in the clamping circuit 70 including the resistance element 71, the first clamping element 72, and the second clamping element 73, the first clamping element 72 includes a P-type MOS transistor. The P-type MOS transistor is connected between the other end (output end) of the resistance element 71 and the reference potential node (for example, the ground), and has a diode-connected configuration in which the gate electrode and the source electrode are connected in common.

As described above, in the light receiving device 30 according to Example 5, a P-type MOS transistor of a diode-connected configuration is used as the first clamping element 72 included in the clamping circuit 70 in place of the clamping diode of Example 1. Thus, even with the configuration in which a P-type MOS transistor of a diode-connected configuration is used as the first clamping element 72, similar action and effect to those in the case of Example 1 can be obtained, that is, when the SPAD element 51 is irradiated with a large amount of light not less than a predetermined amount of light and an overvoltage occurs, circuit elements such as the readout circuit 56 in a later stage can be protected from overvoltage.

Example 6

Figure 17:
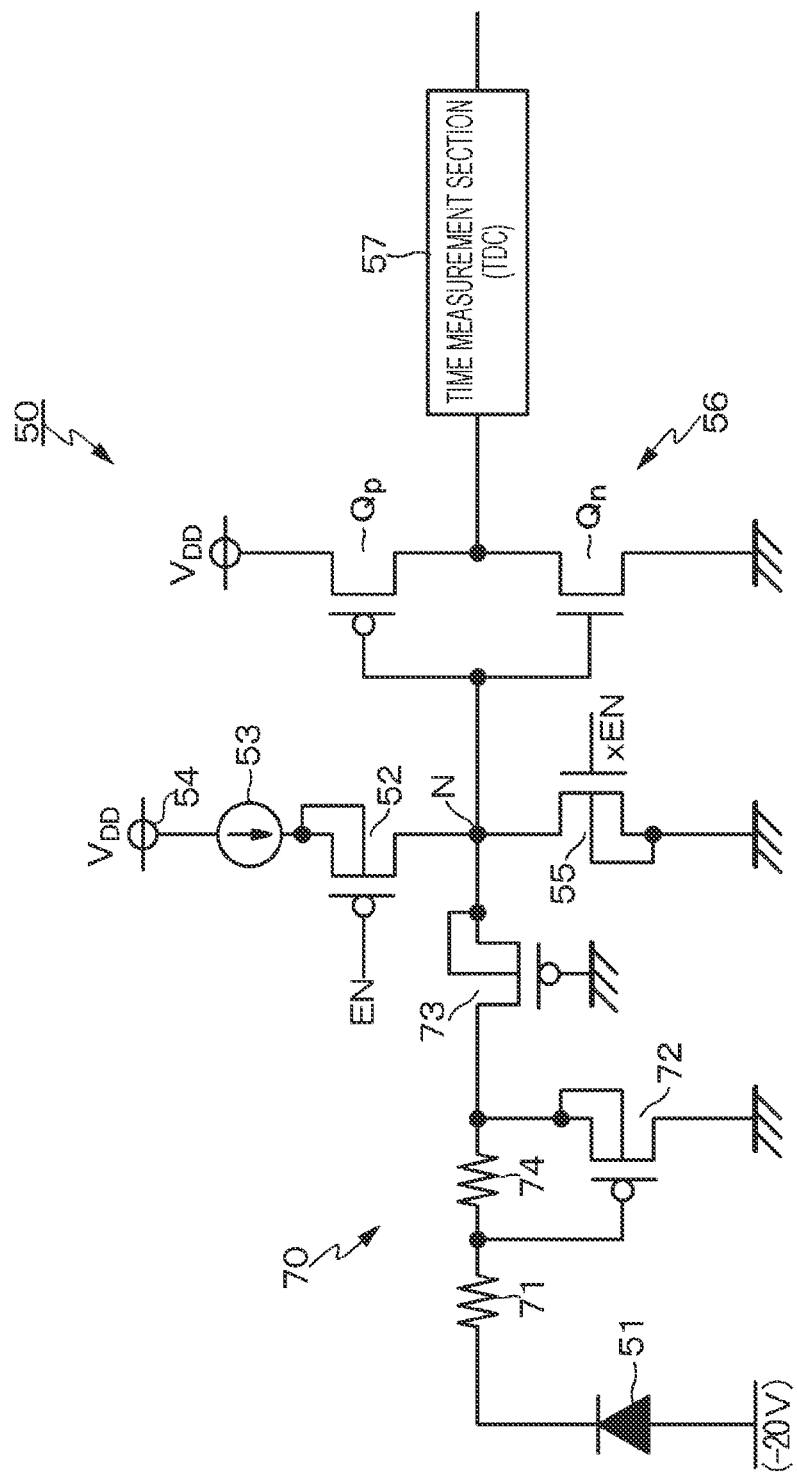
FIG. 17 is a circuit diagram showing a configuration example of a light receiving device according to Example 6.

Example 6 is a modification example of Example 5, and is an example in which a P-type MOS transistor is used as the first clamping element 73 and a resistance element is provided between the gate and the drain of the P-type MOS transistor. FIG. 17 shows a circuit diagram of a configuration example of the light receiving device 30 according to Example 6.

In the light receiving device 30 according to Example 6, in the clamping circuit 70 including the resistance element 71, the first clamping element 72, and the second clamping element 73, the first clamping element 72 includes a second resistance element 74 connected in series to the resistance element 71 and a P-type MOS transistor connected between the output end of the second resistance element 74 and the reference potential node (for example, the ground). In the P-type MOS transistor, the gate electrode is connected to a common connection node between the resistance element 71 and the second resistance element 74.

As described above, in the light receiving device 30 according to Example 6, the second resistance element 74 is connected in series to the resistance element 71, and the gate electrode of the P-type MOS transistor is connected to a common connection node between the resistance element 71 and the second resistance element 74. With this configuration, since the P-type MOS transistor can be completely brought into a conduction state (ON state), the voltage of the common connection node between the source electrode of the P-type MOS transistor and the output end of the second resistance element 74 does not become a negative voltage. Therefore, in the case of Example 6, the second clamping element 73 may be omitted.

Example 7

Figure 18:
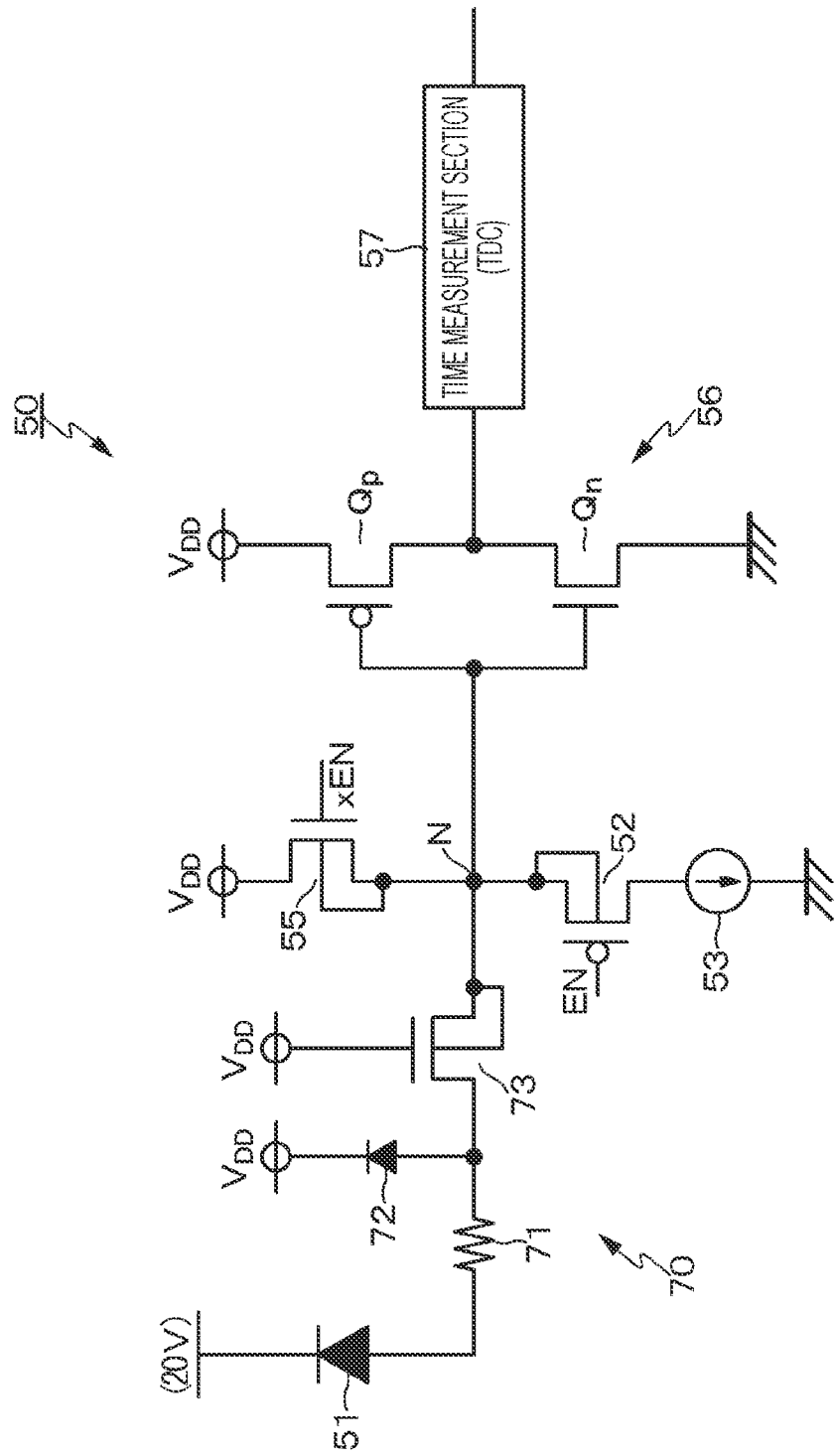
FIG. 18 is a circuit diagram showing a configuration example of a light receiving device according to Example 7.

Example 7 is an example of a positive bias configuration, and is an example in which the protection circuit 60 includes a clamping circuit. FIG. 18 shows a circuit diagram of a configuration example of the light receiving device 30 according to Example 7.

The light receiving device 30 according to Example 7 has a positive bias configuration in which a positive bias voltage (for example, about 20 V) is applied to the cathode electrode of the SPAD element 51, and uses, as the protection circuit 60, a clamping circuit 70 that clamps an overvoltage to a certain voltage. That is, the light receiving device 30 according to Example 7 of a positive bias configuration has a circuit configuration corresponding to the light receiving device 30 according to Example 1 of a negative bias configuration.

As shown in FIG. 18, the clamping circuit 70 includes the resistance element 71, the first clamping element 72, and the second clamping element 73. One end of the resistance element 71 is connected to the anode electrode of the SPAD element 51. The first clamping element 72 includes, for example, a clamping diode, and the anode electrode is connected to the other end (output end) of the resistance element 71 and the cathode electrode is connected to a node of the power supply voltage $V_{DD}$. The second clamping element 73 includes, for example, an N-type MOS transistor and is connected between the first clamping element 72 and the node N, and the gate electrode is connected to a node of the power supply voltage $V_{DD}$.

By using the light receiving device 30 according to Example 7 of the above configuration, even in a case where the SPAD element 51 is irradiated with a large amount of light not less than a predetermined amount of light and an overvoltage occurs, the readout circuit 56 in a later stage can be protected from overvoltage by the action of the clamping circuit 70 provided as the protection circuit 60. More specifically, the P-type MOS transistor $Q_p$ and the N-type MOS transistor $Q_n$ included in the readout circuit 56 and the first control transistor 52 and the second control transistor 55 can be protected from overvoltage.

Example 8

Figure 19:
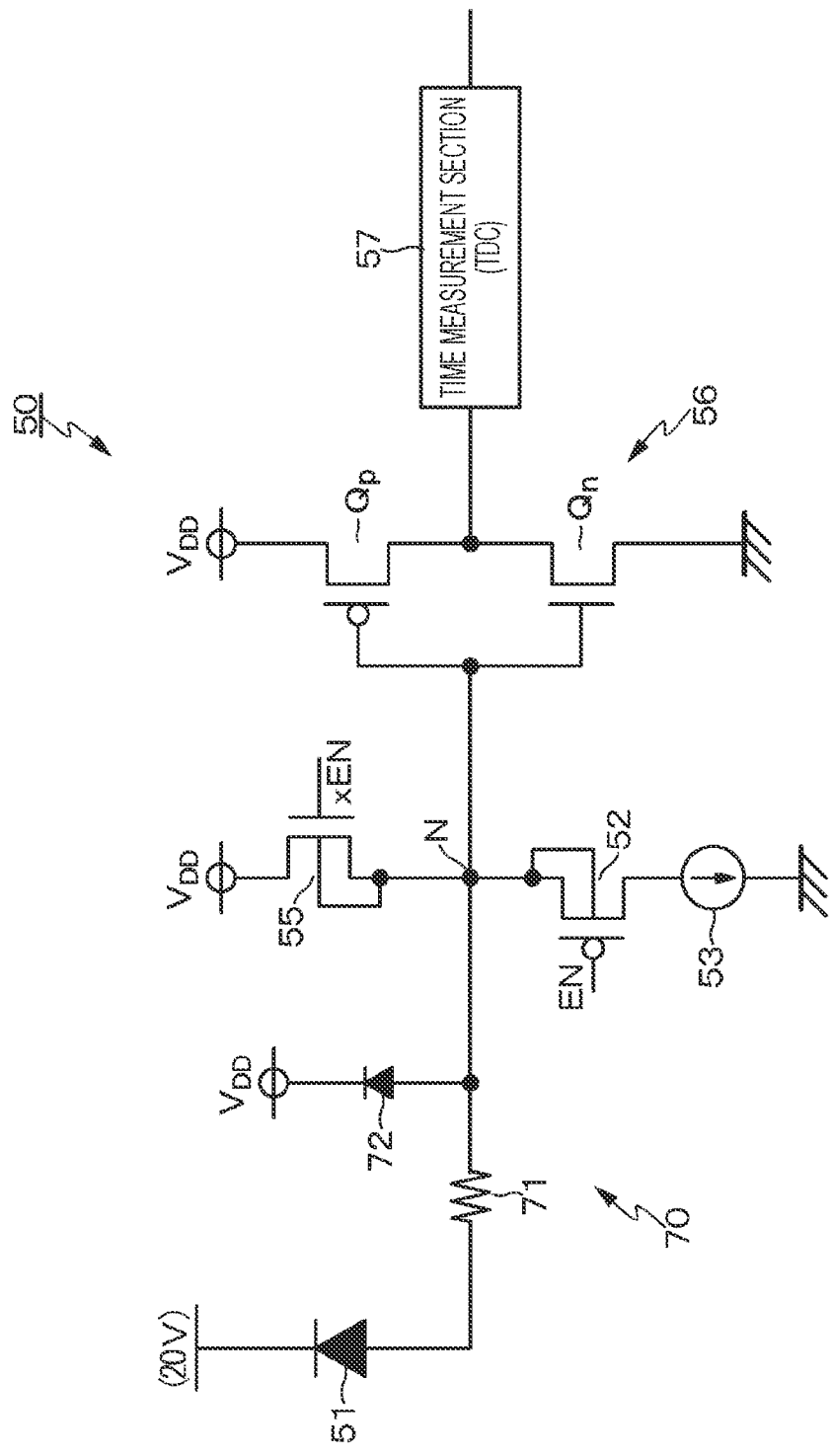
FIG. 19 is a circuit diagram showing a configuration example of a light receiving device according to Example 8.

Example 8 is a modification example of Example 7, and is an example in which the second clamping element is omitted. FIG. 19 shows a circuit diagram of a configuration example of the light receiving device 30 according to Example 8.

In the light receiving device 30 according to Example 8, the clamping circuit 70 includes the resistance element 71 and the first clamping element 72. That is, the light receiving device 30 according to Example 8 has a configuration in which the second clamping element 73, which is used as a constituent element of the clamping circuit 70 in Example 7, is omitted, and has a circuit configuration corresponding to the light receiving device 30 according to Example 2 of a negative bias configuration. Therefore, by using the light receiving device 30 according to Example 8, basically similar action and effect to those in the case of the light receiving device 30 according to Example 2 can be obtained.

Example 9

Figure 20:
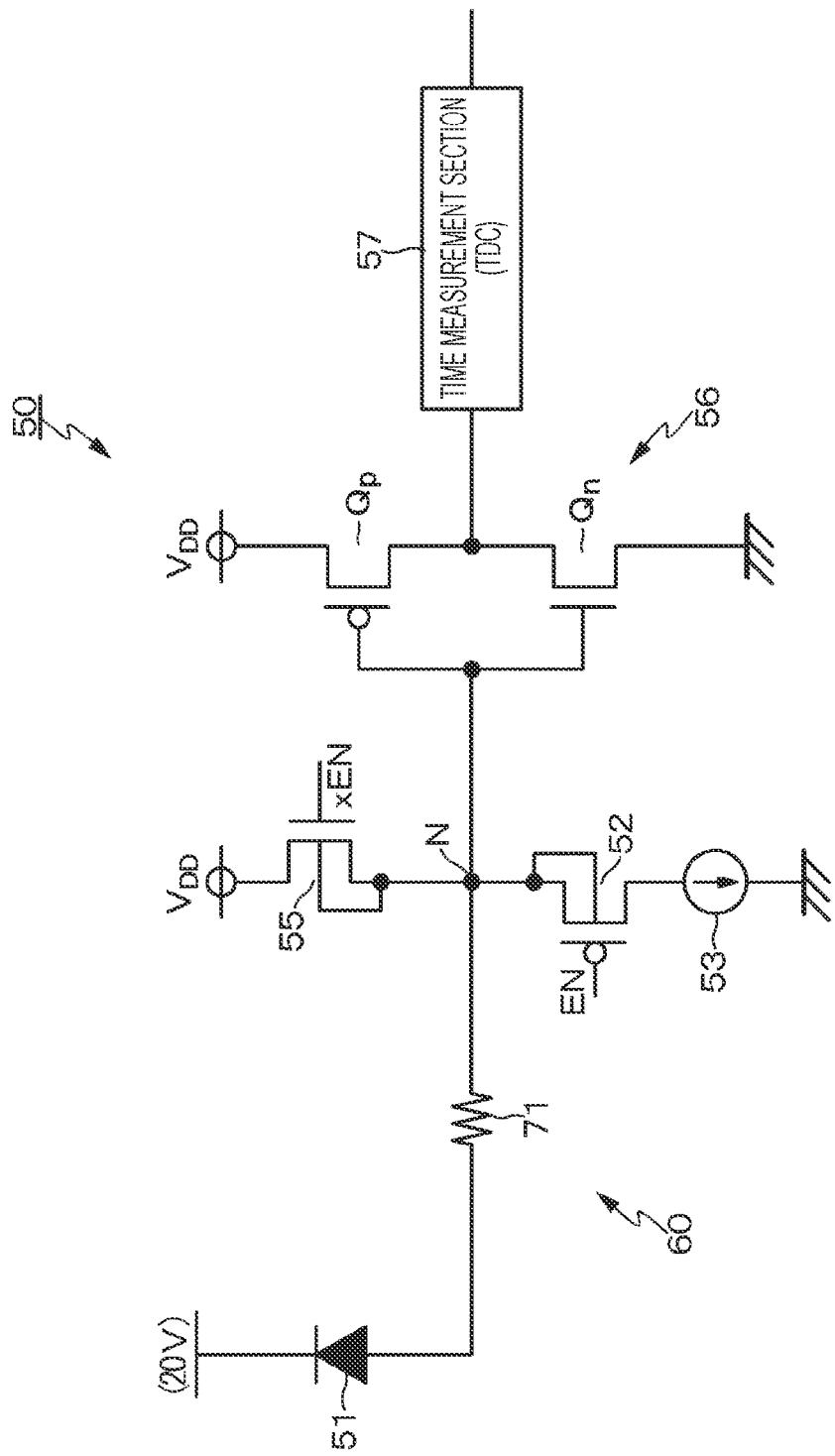
FIG. 20 is a circuit diagram showing a configuration example of a light receiving device according to Example 9.

Example 9 is an example of a positive bias configuration, and is an example in which the protection circuit 60 includes a resistance element. FIG. 20 shows a circuit diagram of a configuration example of the light receiving device 30 according to Example 9.

In the light receiving device 30 according to Example 9, the protection circuit 60 includes the resistance element 71 connected between the SPAD element 51 and the input end of the readout circuit 56, that is, the node N. That is, the light receiving device 30 according to Example 3 has a configuration in which the first clamping element 72 and the second clamping element 73, which are used as constituent elements of the clamping circuit 70 in Example 1, are omitted, and has a circuit configuration corresponding to the light receiving device 30 according to Example 3 of a negative bias configuration. Therefore, by using the light receiving device 30 according to Example 9, basically similar action and effect to those in the case of the light receiving device 30 according to Example 3 can be obtained.

Modification Examples

Hereinabove, the technology according to the present disclosure is described on the basis of preferred embodiments; however, the technology according to the present disclosure is not limited to the embodiments. The configurations and structures of the light receiving device and the distance measuring device described in the above embodiments are examples, and the light receiving device and the distance measuring device may be altered as appropriate.

For example, also in the light receiving device 30 according to Example 7 of a positive bias configuration, the first clamping element 72 may have a configuration similar to that of the light receiving device 30 according to any of Example 4 to Example 6 of a negative bias configuration. That is, the first clamping element 72 may have a configuration using a MOS transistor of a diode-connected configuration or a configuration including a combination of a second resistance element and a MOS transistor.

Application Example of Technology According to Present Disclosure

The technology according to the present disclosure can be applied to various products. Hereinafter, a more specific application example will be described. For example, the technology according to the present disclosure may be realized as a distance measuring device mounted on any type of mobile body such as an automobile, an electric vehicle, a hybrid electric vehicle, a motorcycle, a bicycle, a personal mobility, an airplane, a drone, a ship, a robot, a construction machine, and an agricultural machine (tractor).

[Mobile Body]

Figure 21:
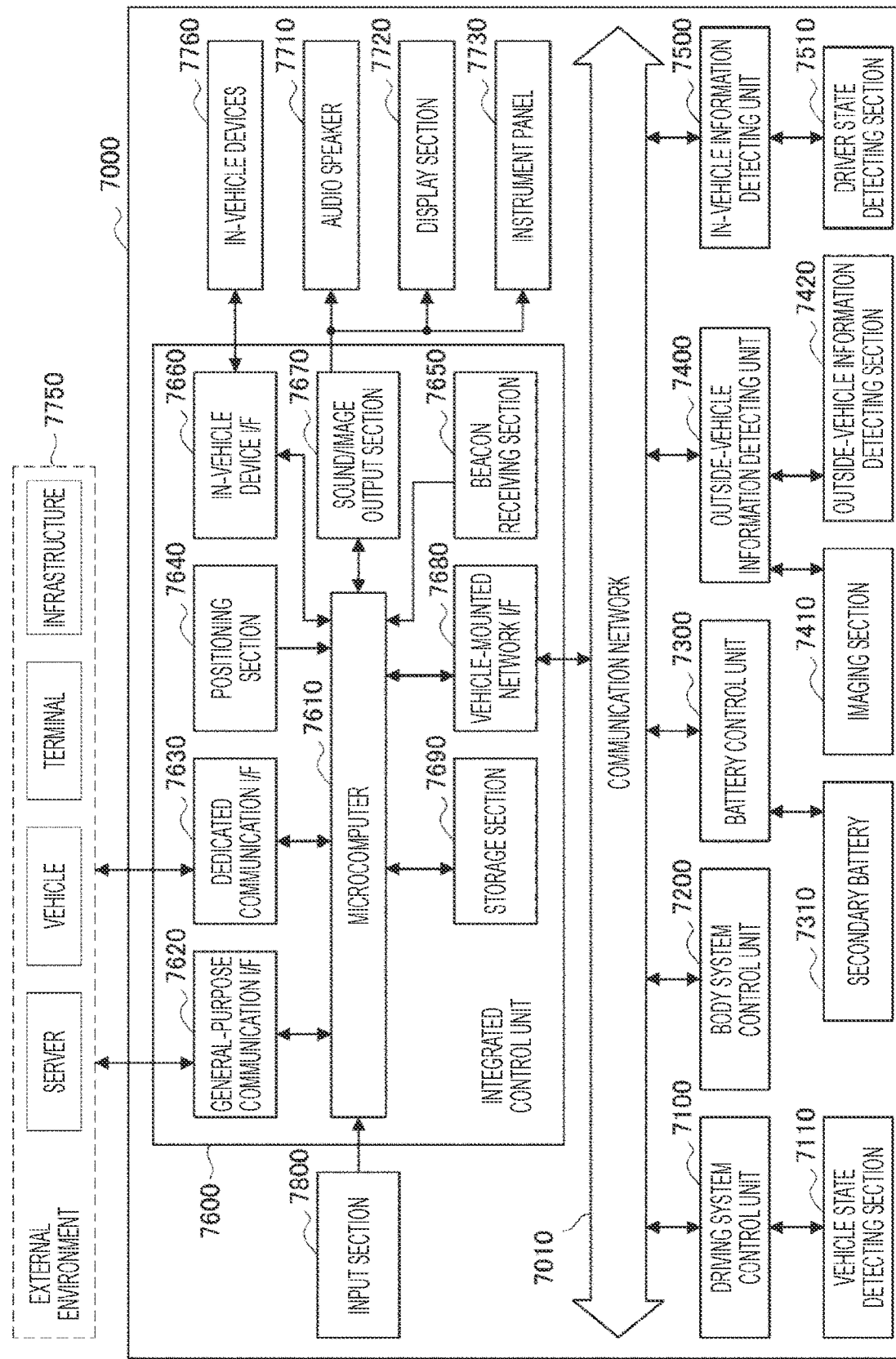
FIG. 21 is a block diagram showing an example of a schematic configuration of a vehicle control system that is an example of a mobile body control system to which the technology according to the present disclosure can be applied.

FIG. 21 is a block diagram showing an example of schematic configuration of a vehicle control system 7000 as an example of a mobile body control system to which the technology according to an embodiment of the present disclosure can be applied. The vehicle control system 7000 includes a plurality of electronic control units connected to each other via a communication network 7010. In the example depicted in FIG. 21, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay (registered trademark), or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or radio communication. A functional configuration of the integrated control unit 7600 illustrated in FIG. 21 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, and sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 and an outside-vehicle information detecting section 7420. The imaging section 7410 includes at least one of a time-of-flight (ToF) camera, a stereo camera, a monocular camera, an infrared camera, and other cameras. The outside-vehicle information detecting section 7420, for example, includes at least one of an environmental sensor for detecting current atmospheric conditions or weather conditions and a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, and a snow sensor detecting a snowfall. The peripheral information detecting sensor may be at least one of an ultrasonic sensor, a radar device, and a LIDAR device (light detection and ranging device, or laser imaging detection and ranging device). Each of the imaging section 7410 and the outside-vehicle information detecting section 7420 may be provided as an independent sensor or device, or may be provided as a device in which a plurality of sensors or devices is integrated.

Figure 22:
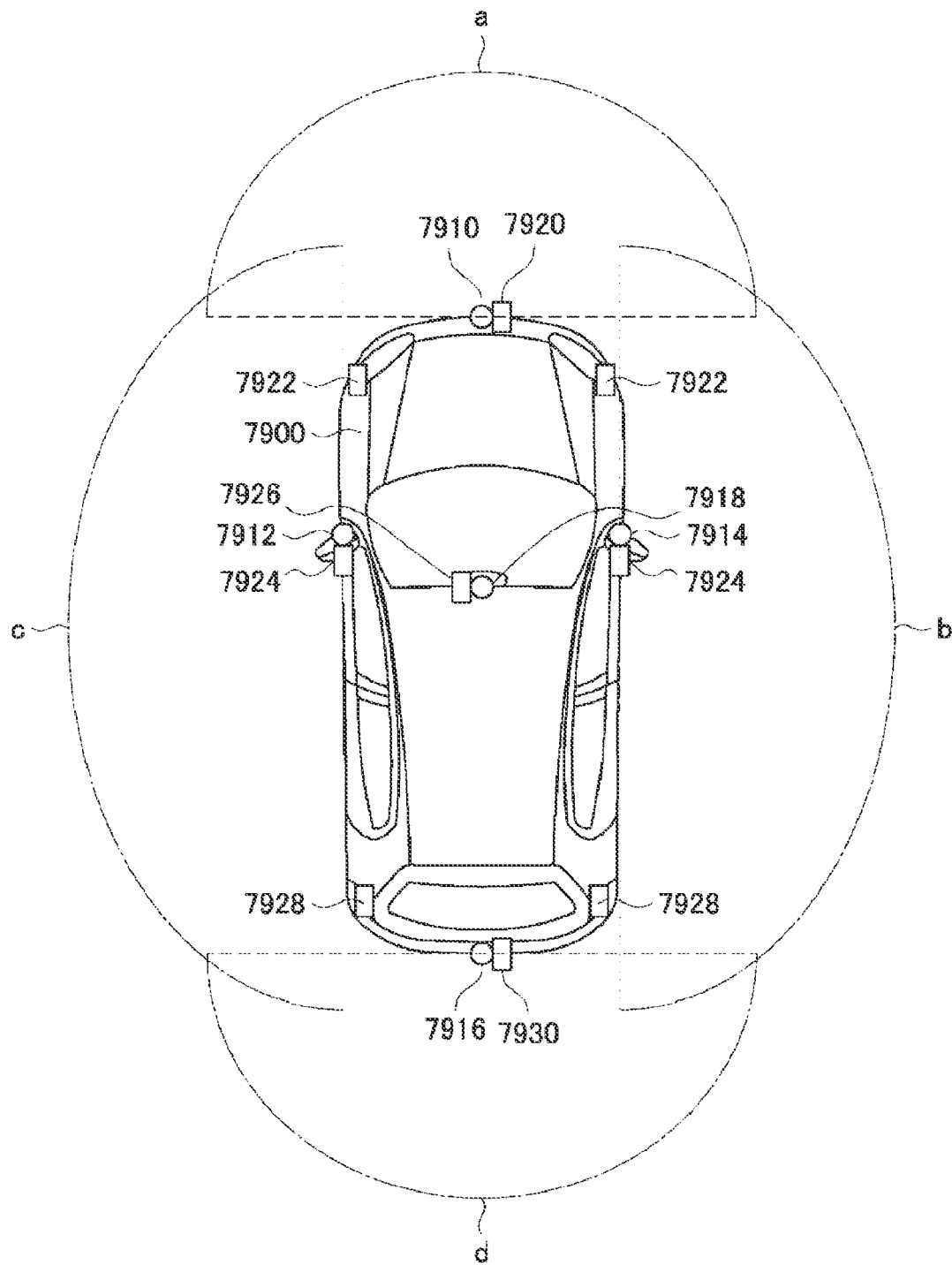
FIG. 22 is a diagram showing an example of installation positions of an imaging section and an outside-vehicle information detecting section.

Here, FIG. 22 depicts an example of installation positions of the imaging section 7410 and the outside-vehicle information detecting section 7420. Imaging sections 7910, 7912, 7914, 7916, and 7918 are, for example, disposed at at least one of positions on a front nose, sideview mirrors, a rear bumper, and a back door of the vehicle 7900 and a position on an upper portion of a windshield within the interior of the vehicle. The imaging section 7910 provided to the front nose and the imaging section 7918 provided to the upper portion of the windshield within the interior of the vehicle obtain mainly an image of the front of the vehicle 7900. The imaging sections 7912 and 7914 provided to the sideview mirrors obtain mainly an image of the sides of the vehicle 7900. The imaging section 7916 provided to the rear bumper or the back door obtains mainly an image of the rear of the vehicle 7900. The imaging section 7918 provided to the upper portion of the windshield within the interior of the vehicle is used mainly to detect a preceding vehicle, a pedestrian, an obstacle, a signal, a traffic sign, a lane, or the like.

Incidentally, FIG. 22 depicts an example of imaging ranges of the respective imaging sections 7910, 7912, 7914, and 7916. An imaging range a represents the imaging range of the imaging section 7910 provided to the front nose. Imaging ranges b and c respectively represent the imaging ranges of the imaging sections 7912 and 7914 provided to the sideview mirrors. An imaging range d represents the imaging range of the imaging section 7916 provided to the rear bumper or the back door. A bird's-eye image of the vehicle 7900 as viewed from above can be obtained by superimposing image data imaged by the imaging sections 7910, 7912, 7914, and 7916, for example.

Outside-vehicle information detecting sections 7920, 7922, 7924, 7926, 7928, and 7930 provided to the front, rear, sides, and corners of the vehicle 7900 and the upper portion of the windshield within the interior of the vehicle may be, for example, an ultrasonic sensor or a radar device. The outside-vehicle information detecting sections 7920, 7926, and 7930 provided to the front nose of the vehicle 7900, the rear bumper, the back door of the vehicle 7900, and the upper portion of the windshield within the interior of the vehicle may be a LIDAR device, for example. These outside-vehicle information detecting sections 7920 to 7930 are used mainly to detect a preceding vehicle, a pedestrian, an obstacle, or the like.

Returning to FIG. 21, the description will be continued. The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging sections 7410 to generate a bird's-eye image or a panoramic image. The outside-vehicle information detecting unit 7400 may perform viewpoint conversion processing using the image data imaged by the imaging section 7410 including the different imaging parts.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system of mobile communications (GSM (registered trademark)), WiMAX, long term evolution (LTE), LTE-advanced (LTE-A), or the like, or another wireless communication protocol such as wireless LAN (referred to also as wireless fidelity (Wi-Fi (registered trademark)), Bluetooth (registered trademark), or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handyphone system (PHS), or a smart phone that has a positioning function.

The beacon receiving section 7650, for example, receives a radio wave or an electromagnetic wave transmitted from a radio station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth (registered trademark), near field communication (NFC), or wireless universal serial bus (WUSB). In addition, the in-vehicle device I/F 7660 may establish wired connection by universal serial bus (USB), high-definition multimedia interface (HDMI (registered trademark)), mobile high-definition link (MHL), or the like via a connection terminal (and a cable if necessary) not depicted in the figures. The in-vehicle devices 7760 may, for example, include at least one of a mobile device and a wearable device possessed by an occupant and an information device carried into or attached to the vehicle. The in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automated driving, which makes the vehicle to travel automatedly without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound and an image to an output device capable of visually or auditorily notifying information to an occupant of the vehicle or the outside of the vehicle. In the example of FIG. 21, an audio speaker 7710, a display section 7720, and an instrument panel 7730 are illustrated as the output device. The display section 7720 may, for example, include at least one of an on-board display and a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 21 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

Hereinabove, an example of a vehicle control system to which the technology according to the present disclosure can be applied is described. In a case where among the above-described components, for example, the imaging section 7410 or the outside-vehicle information detecting section 7420 includes a ToF camera (ToF sensor), the light receiving device according to any of the above-described embodiments of the technology according to the present disclosure can be used as the ToF camera. By mounting the light receiving device as the ToF camera of the distance measuring device, for example, in a case where the light receiving element is irradiated with a large amount of light not less than a predetermined amount of light and an overvoltage occurs in the light receiving element, element breaking due to the overvoltage can be prevented, and therefore a highly reliable vehicle control system can be constructed.

<Configuration that can be Taken by the Present Disclosure>

Note that the present disclosure may have the following configurations.

<<A. Light Receiving Device>>

[A-1] A light receiving device including:

a light receiving element that generates a signal in response to reception of a photon;

a readout circuit that reads out a signal generated by the light receiving element; and a protection circuit that is provided between the light receiving element and an input end of the readout circuit and protects a circuit element of the readout circuit from overvoltage.

[A-2] The light receiving device according to [A-1], in which the protection circuit includes a clamping circuit that clamps an overvoltage to a certain voltage.

[A-3] The light receiving device according to [A-2], in which the clamping circuit includes:

a resistance element of which one end is connected to the light receiving element; and a first clamping element connected between another end of the resistance element and a reference potential node.

[A-4] The light receiving device according to [A-3], in which the first clamping element includes a clamping diode in which a cathode electrode is connected to the another end of the resistance element and an anode electrode is connected to the reference potential node.

[A-5] The light receiving device according to [A-3] or [A-4], in which the clamping circuit includes a second clamping element provided between the first clamping element and the input end of the readout circuit.

[A-6] The light receiving device according to [A-5], in which the second clamping element includes a MOS transistor that is connected between the first clamping element and the input end of the readout circuit and in which a gate electrode is connected to the reference potential node.

[A-7] The light receiving device according to [A-5] or [A-6], having a stacked chip structure in which at least two semiconductor substrates of a first semiconductor substrate and a second semiconductor substrate are stacked, in which the light receiving element is placed on the first semiconductor substrate, and the resistance element, the first clamping element, and the second clamping element are placed on the second semiconductor substrate.

[A-8] The light receiving device according to [A-5] or [A-6], having a stacked chip structure in which at least two semiconductor substrates of a first semiconductor substrate and a second semiconductor substrate are stacked, in which the light receiving element and the resistance element are placed on the first semiconductor substrate, and the first clamping element and the second clamping element are placed on the second semiconductor substrate.

[A-9] The light receiving device according to [A-5] or [A-6], having a stacked chip structure in which at least two semiconductor substrates of a first semiconductor substrate and a second semiconductor substrate are stacked, in which the light receiving element is placed on the first semiconductor substrate, and the resistance element, the first clamping element, and the second clamping element are placed on the second semiconductor substrate.

[A-10] The light receiving device according to [A-1], in which the protection circuit includes a resistance element connected between the light receiving element and the input end of the readout circuit.

[A-11] The light receiving device according to [A-10], further including:

an N-type MOS transistor connected between the input end of the readout circuit and a reference potential node, in which the resistance element included in the protection circuit forms a clamping circuit together with a body diode present in the N-type MOS transistor.

[A-12] The light receiving device according to [A-3], in which the first clamping element includes a MOS transistor of a diode-connected configuration.

[A-13] The light receiving device according to [A-3], in which the first clamping element includes:

a second resistance element connected in series to the resistance element; and a P-type MOS transistor connected between an output end of the second resistance element and the reference potential node, and a gate electrode of the P-type MOS transistor is connected to a common connection node between the resistance element and the second resistance element.

[A-14] The light receiving device according to any one of [A-1] to [A-13], in which the readout circuit includes a CMOS inverter circuit.

[A-15] The light receiving device according to any one of [A-1] to [A-14], in which the light receiving element is an element used by applying a voltage not less than a breakdown voltage.

[A-16] The light receiving device according to [A-15], in which the light receiving element includes an avalanche photodiode that operates in a Geiger mode.

[A-17] The light receiving device according to [A-16], in which the light receiving element includes a single-photon avalanche diode.

[A-18] The light receiving device according to [A-17], in which the single-photon avalanche diode is used by applying a negative bias voltage to an anode electrode.

[A-19] The light receiving device according to [A-17], in which the single-photon avalanche diode is used by applying a positive bias voltage to a cathode electrode.

<<B. Distance Measuring Device>>

[B-1] A distance measuring device including:

a light source section that applies light to a distance measurement target; and a light receiving device that receives reflected light from the distance measurement target based on applied light from the light source section, in which the light receiving device includes:

a light receiving element that generates a signal in response to reception of a photon;

a readout circuit that reads out a signal generated by the light receiving element; and a protection circuit that is provided between the light receiving element and the readout circuit and protects a circuit element of the readout circuit from overvoltage.

[B-2] The distance measuring device according to [B-1], in which the protection circuit includes a clamping circuit that clamps an overvoltage to a certain voltage.

[B-3] The distance measuring device according to [B-2], in which the clamping circuit includes:

a resistance element of which one end is connected to the light receiving element; and a first clamping element connected between another end of the resistance element and a reference potential node.

[B-4] The distance measuring device according to [B-3], in which the first clamping element includes a clamping diode in which a cathode electrode is connected to the another end of the resistance element and an anode electrode is connected to the reference potential node.

[B-5] The distance measuring device according to [B-3] or [B-4], in which the clamping circuit includes a second clamping element provided between the first clamping element and the input end of the readout circuit.

[B-6] The distance measuring device according to [B-5], in which the second clamping element includes a MOS transistor that is connected between the first clamping element and the input end of the readout circuit and in which a gate electrode is connected to the reference potential node.

[B-7] The distance measuring device according to [B-5] or [B-6], having a stacked chip structure in which at least two semiconductor substrates of a first semiconductor substrate and a second semiconductor substrate are stacked, in which the light receiving element is placed on the first semiconductor substrate, and the resistance element, the first clamping element, and the second clamping element are placed on the second semiconductor substrate.

[B-8] The distance measuring device according to [B-5] or [B-6], having a stacked chip structure in which at least two semiconductor substrates of a first semiconductor substrate and a second semiconductor substrate are stacked, in which the light receiving element and the resistance element are placed on the first semiconductor substrate, and the first clamping element and the second clamping element are placed on the second semiconductor substrate.

[B-9] The distance measuring device according to [B-5] or [B-6], having a stacked chip structure in which at least two semiconductor substrates of a first semiconductor substrate and a second semiconductor substrate are stacked, in which the light receiving element is placed on the first semiconductor substrate, and the resistance element, the first clamping element, and the second clamping element are placed on the second semiconductor substrate.

[B-10] The distance measuring device according to [B-1], in which the protection circuit includes a resistance element connected between the light receiving element and the input end of the readout circuit.

[B-11] The distance measuring device according to [B-10], further including:

an N-type MOS transistor connected between the input end of the readout circuit and a reference potential node, in which the resistance element included in the protection circuit forms a clamping circuit together with a body diode present in the N-type MOS transistor.

[B-12] The distance measuring device according to [B-3], in which the first clamping element includes a MOS transistor of a diode-connected configuration.

[B-13] The distance measuring device according to [B-3], in which the first clamping element includes:

a second resistance element connected in series to the resistance element; and a P-type MOS transistor connected between an output end of the second resistance element and the reference potential node, and a gate electrode of the P-type MOS transistor is connected to a common connection node between the resistance element and the second resistance element.

[B-14] The distance measuring device according to any one of [B-1] to [B-13], in which the readout circuit includes a CMOS inverter circuit.

[B-15] The distance measuring device according to any one of [B-1] to [B-14], in which the light receiving element is an element used by applying a voltage not less than a breakdown voltage.

[B-16] The distance measuring device according to [B-15], in which the light receiving element includes an avalanche photodiode that operates in a Geiger mode.

[B-17] The distance measuring device according to [B-16], in which the light receiving element includes a single-photon avalanche diode.

[B-18] The distance measuring device according to [B-17], in which the single-photon avalanche diode is used by applying a negative bias voltage to an anode electrode.

[B-19] The distance measuring device according to [B-17], in which the single-photon avalanche diode is used by applying a positive bias voltage to a cathode electrode.

REFERENCE SIGNS LIST

1 Distance measuring device
10 Subject
20 Light source section
21 Laser driving section
22 Laser light source
23 Diffusion lens
30 Light receiving device
31 Light receiving lens
32 Optical sensor
33 Signal processing section
40 Control section
50 Pixel
51 SPAD element
56 Readout circuit
57 Time measurement section (TDC)
60 Protection circuit
70 Clamping circuit

The invention claimed is:

1. A light receiving device comprising:
a light receiving element that generates a signal in response to reception of a photon;
a readout circuit that reads out a signal generated by the light receiving element; and
a protection circuit that is provided between the light receiving element and an input end of the readout circuit and protects a circuit element of the readout circuit from overvoltage.

2. The light receiving device according to claim 1, wherein
the protection circuit includes a clamping circuit that clamps an overvoltage to a certain voltage.

3. The light receiving device according to claim 2, wherein
the clamping circuit includes:
a resistance element of which one end is connected to the light receiving element; and a first clamping element connected between another end of the resistance element and a reference potential node.

4. The light receiving device according to claim 3, wherein
the first clamping element includes a clamping diode in which a cathode electrode is connected to the another end of the resistance element and an anode electrode is connected to the reference potential node.

5. The light receiving device according to claim 3, wherein
the clamping circuit includes
a second clamping element provided between the first clamping element and the input end of the readout circuit.

6. The light receiving device according to claim 5, wherein
the second clamping element includes a MOS transistor that is connected between the first clamping element and the input end of the readout circuit and in which a gate electrode is connected to the reference potential node.

7. The light receiving device according to claim 5, having a stacked chip structure in which at least two semiconductor substrates of a first semiconductor substrate and a second semiconductor substrate are stacked,
wherein the light receiving element is placed on the first semiconductor substrate, and
the resistance element, the first clamping element, and the second clamping element are placed on the second semiconductor substrate.

8. The light receiving device according to claim 5, having a stacked chip structure in which at least two semiconductor substrates of a first semiconductor substrate and a second semiconductor substrate are stacked,
wherein the light receiving element and the resistance element are placed on the first semiconductor substrate, and
the first clamping element and the second clamping element are placed on the second semiconductor substrate.

9. The light receiving device according to claim 5, having a stacked chip structure in which at least two semiconductor substrates of a first semiconductor substrate and a second semiconductor substrate are stacked,
wherein the light receiving element, the resistance element, and the first clamping element are placed on the first semiconductor substrate, and
the second clamping element is placed on the second semiconductor substrate.

10. The light receiving device according to claim 1, wherein
the protection circuit includes a resistance element connected between the light receiving element and the input end of the readout circuit.

11. The light receiving device according to claim 10, further comprising:
an N-type MOS transistor connected between the input end of the readout circuit and a reference potential node,
wherein the resistance element included in the protection circuit forms a clamping circuit together with a body diode present in the N-type MOS transistor.

12. The light receiving device according to claim 3, wherein
the first clamping element includes a MOS transistor of a diode-connected configuration.

13. The light receiving device according to claim 3, wherein
the first clamping element includes:
a second resistance element connected in series to the resistance element; and
a P-type MOS transistor connected between an output end of the second resistance element and the reference potential node, and
a gate electrode of the P-type MOS transistor is connected to a common connection node between the resistance element and the second resistance element.

14. The light receiving device according to claim 1, wherein
the readout circuit includes a CMOS inverter circuit.

15. The light receiving device according to claim 1, wherein
the light receiving element is an element used by applying a voltage not less than a breakdown voltage.

16. The light receiving device according to claim 15, wherein
the light receiving element includes an avalanche photodiode that operates in a Geiger mode.

17. The light receiving device according to claim 16, wherein
the light receiving element includes a single-photon avalanche diode.

18. The light receiving device according to claim 17, wherein
the single-photon avalanche diode is used by applying a negative bias voltage to an anode electrode.

19. The light receiving device according to claim 17, wherein
the single-photon avalanche diode is used by applying a positive bias voltage to a cathode electrode.

20. A distance measuring device comprising:
a light source section that applies light to a distance measurement target; and
a light receiving device that receives reflected light from the distance measurement target based on applied light from the light source section,
wherein the light receiving device includes:
a light receiving element that generates a signal in response to reception of a photon;
a readout circuit that reads out a signal generated by the light receiving element; and
a protection circuit that is provided between the light receiving element and the readout circuit and protects a circuit element of the readout circuit from overvoltage.

* * * * *